United States Patent [19]
Malcolm, Jr. et al.

[11] Patent Number: 6,052,152
[45] Date of Patent: *Apr. 18, 2000

[54] DIGITAL CARRIER SYNTHESIS BY COUNTING CYCLES FOR SYNCHRONIZATION TO A REFERENCE SIGNAL THAT IS ASYNCHRONOUS WITH RESPECT TO A DIGITAL SAMPLING CLOCK

[75] Inventors: Ronald D. Malcolm, Jr.; Juergen M Lutz, both of Austin, Tex.

[73] Assignee: Crystal Semiconductor Corp., Fremont, Calif.

[*] Notice: This patent is subject to a terminal disclaimer.

[21] Appl. No.: 09/070,100

[22] Filed: Apr. 27, 1998

Related U.S. Application Data

[62] Division of application No. 08/571,268, Dec. 12, 1995, Pat. No. 5,808,691.

[51] Int. Cl.$^7$ .................................................... H04N 5/12
[52] U.S. Cl. ............................ 348/537; 348/539; 348/549
[58] Field of Search ..................................... 348/537, 536, 348/539, 549, 505, 506, 540, 639; H04N 5/12, 9/45

[56] References Cited

U.S. PATENT DOCUMENTS

| | | | |
|---|---|---|---|
| 4,694,326 | 9/1987 | Demmer | 358/19 |
| 5,355,171 | 10/1994 | Miyazaki et al. | 348/505 |
| 5,719,512 | 2/1998 | Murayama | 327/159 |
| 5,808,691 | 9/1998 | Malcolm, Jr. et al. | 348/537 |

*Primary Examiner*—Chris Grant
*Attorney, Agent, or Firm*—Arnold White & Durkee

[57] ABSTRACT

A periodic multi-bit digital signal is synthesized having a frequency that is specified by the frequency of a periodic reference signal that is asynchronous with respect to a sampling clock of the periodic digital signal. In a digital video system, for example, a digital color subcarrier is synthesized and synchronized to a reference frequency of a crystal oscillator that is asynchronous with respect to a digital system clock for the digital video system. The periodic digital signal is generated by an adjustable digital oscillator clocked by the sampling clock. The frequency or phase of the periodic digital signal is compared to the frequency or phase of the periodic reference signal to produce an adjustment value for adjusting the periodic digital signal to synchronize the periodic digital signal with the periodic reference signal. The digital oscillator, for example, generates the periodic digital signal at the sampling rate by periodically incrementing an accumulator with the adjustment value. The frequency or phase of the periodic digital signal is compared to the frequency or phase of the periodic reference signal, for example, by an up/down counter that is incremented or decremented each cycle of the reference signal and is decremented or incremented each cycle of the digital carrier signal to compute the adjustment value.

20 Claims, 16 Drawing Sheets

DIGITAL CARRIER SYNTHESIS BY COUNTING CYCLES FOR SYNCHRONIZATION TO A REFERENCE SIGNAL THAT IS ASYNCHRONOUS WITH RESPECT TO A DIGITAL SAMPLING CLOCK

This appln is a Div of 08/571,268 Dec. 12, 1995 now U.S. Pat. No. 5,808,691.

BACKGROUND OF THE INVENTION

1. Field of the Invention

The present invention relates generally to the synthesis of a periodic digital signal having a frequency that is specified by the frequency of a periodic reference signal that is asynchronous with respect to a sampling clock of the periodic digital signal. A preferred embodiment of the present invention specifically relates to a digital video system in which a digital color subcarrier is synthesized and synchronized to a reference frequency of a crystal oscillator that is asynchronous with respect to a digital system clock for the digital video system.

2. Background Art

Due to advances in semiconductor technology such as large scale integration and complementary metal-oxide-semiconductor processes suitable for mixed analog and digital applications, it has become common to fabricate complex integrated circuit chips that perform traditional analog signal processing functions in the digital domain. Typically the signal processing is performed by digital logic that is synchronized to a system clock that determines the digital sampling rate. The traditional analog signal processing functions, however, may require the use or manipulation of carrier signals that are asynchronous to the system clock.

Although it is known that a carrier signal can be generated by a digital oscillator circuit, the frequency of a carrier signal generated by the digital oscillator circuit is a function of frequency of the system clock. Therefore, there is a problem if the frequency of the carrier must be more stable than the frequency of the system clock.

The problem of generating a digital carrier synchronized to a reference frequency asynchronous with respect to the system clock arises in the design of a digital TV encoder. Digital TV has recently been introduced on a commercial scale and is becoming increasingly popular. In order to economically transmit digital video signals they are first digitized and then digitally compressed on the source side. After transmission (over the air, cable, or by satellite) they are decompressed on the receiver side inside a so-called settop decoder box. Digital compression and decompression is based on international standards like MPEG and JPEG. The output of such a decoder is digital component video data in baseband format.

In order to stay compatible with the input formats of existing television receivers and VCRs, the digital component video in baseband format needs to be converted back into an analog composite video signal. Digital TV encoders are usually used to provide this functionality. Composite video consists of baseband luminance, baseband chrominance, blanking and synchronization signals. The function of a digital encoder is to combine these four components into a single composite waveform in which the chrominance signal is modulated onto the color subcarrier frequency.

A digital TV encoder typically accepts the video data at the MPEG2 clock rate of 27 MHz±1,350 Hz. Therefore, it is desirable to design the digital TV encoder using digital logic circuits clocked at the MPEG2 rate in synchronism with the incoming data. A digital TV encoder, however, also needs to provide a mechanism of creating the color subcarrier frequency. Typically, the color subcarrier frequency is digitally synthesized. The synthesis requires a very stable and accurate clock source. The RS170-A specification, for example, states that the color subcarrier deviation should be no more than 10 Hz at a frequency of 3.579545 MHz. This relates to a deviation of 3 ppm! Typical television receivers can maintain color lock with a subcarrier frequency deviation of 20 ppm worst case. The MPEG2 clock rate of 27 MHz±1, 350 Hz, however, has a deviation of 50 ppm. Such a large deviation upon the frequency of the color subcarrier could result in color shifts and complete loss of color in the typical television receiver.

There are two well known solutions to this problem. The first solution is to provide a long enough FIFO which is clocked on the input side with the incoming MPEG2 clock. Data is taken out of the FIFO at the rate of an outgoing clock that is synchronized to the color subcarrier frequency of 3.579545 MHz. This solution is acceptable so long as the average pixel rate is constant.

The second solution is to use an interpolation filter for interpolating the video data at the rate of the outgoing clock that is synchronized to the color subcarrier frequency of 3.579545 MHz. Such an interpolation filter is usually expensive, since it requires a long FIR filter structure.

In view of the above, there is a need for an improved method of synthesizing a periodic digital signal such as a color subcarrier in a digital system such as a digital TV encoder having a system clock that is asynchronous with respect to the periodic digital signal.

SUMMARY OF THE INVENTION

The present invention provides a method of synthesizing a periodic digital signal that has a series of multi-bit values at a periodic rate of a sampling clock. The periodic digital signal is synchronized to a periodic reference signal having a precise frequency. By "synchronized", it is meant that the frequency of the periodic digital signal is substantially specified by the frequency of the reference signal. The periodic reference signal is asynchronous with respect to the sampling clock, and in particular, the sampling clock may have a frequency that is imprecise in comparison to the frequency of the periodic reference signal.

The periodic digital signal is generated by an adjustable digital oscillator clocked by the sampling clock. The frequency or phase of the periodic digital signal is compared to the frequency or phase of the periodic reference signal to produce an adjustment value for adjusting the periodic digital signal to synchronize the periodic digital signal with the periodic reference signal. The digital oscillator, for example, generates the periodic digital signal at the sampling rate by periodically incrementing an accumulator with the adjustment value. The frequency or phase of the periodic digital signal is compared to the frequency or phase of the periodic reference signal, for example, by an up/down counter that is incremented each cycle of the reference signal and is decremented each cycle of the periodic digital signal to compute the adjustment value.

The present invention provides a digital synthesizer for synthesizing a periodic digital signal that is synchronized to a periodic reference signal that is asynchronous with respect to a sampling clock of the periodic digital signal. The digital synthesizer includes an adjustable digital oscillator clocked by the sampling clock for generating the periodic digital signal. The adjustable digital oscillator has an adjustment input for adjusting the frequency of the periodic digital signal in response to an adjustment value. The digital synthesizer further includes a comparator connected to the adjustable digital oscillator for computing the adjustment value by comparing the frequency or phase of the periodic digital signal to the frequency or phase of the periodic reference signal. The digital oscillator, for example, includes an accumulator that is incremented at the sampling rate by the adjustment value. The frequency or phase comparator, for example, includes an up/down counter that is incremented or decremented each cycle of the periodic reference signal and is decremented or incremented each cycle of the periodic digital signal to compute the adjustment value.

In a preferred embodiment, a digital color subcarrier in a digital TV encoder integrated circuit chip is synthesized and synchronized to a reference frequency of a crystal oscillator that is asynchronous with respect to a digital system clock of the encoder. A digital oscillator clocked by a system clock generates a digital carrier signal, and the frequency of the digital carrier signal is adjusted by an adjustment value computed by comparing the frequency of the digital carrier signal to the reference frequency of the crystal oscillator. The system clock is synchronous with video data samples encoded by the digital TV encoder. The digital carrier signal is used to address read-only memory tables programmed with sine and cosine values to produce digital sine and cosine color subcarriers. A chroma modulator modulates the digital sine and cosine color subcarriers with respective demultiplexed chrominance samples to produce a modulated chroma signal that is combined with luminance samples, sync and blanking to produce a digital composite video signal. In order to prevent any noticeable shift in hue in the active video, the digital oscillator frequency is adjusted only during the horizontal or vertical blanking interval.

In the digital TV encoder, it is also desirable to generate the horizontal and vertical sync and blanking from the system clock instead of from the color carrier reference frequency. In this case, even if the system clock deviates from its nominal value, the fixed relationship between the number of pixels (and system clock cycles) per video line stays constant. In contrast, analog video signals typically have had a fixed relationship between the color subcarrier frequency and the horizontal line rate.

BRIEF DESCRIPTION OF THE DRAWINGS

Other objects and advantages of the invention will become apparent upon reading the following detailed description with reference to the accompanying drawings wherein.

Figure 1:
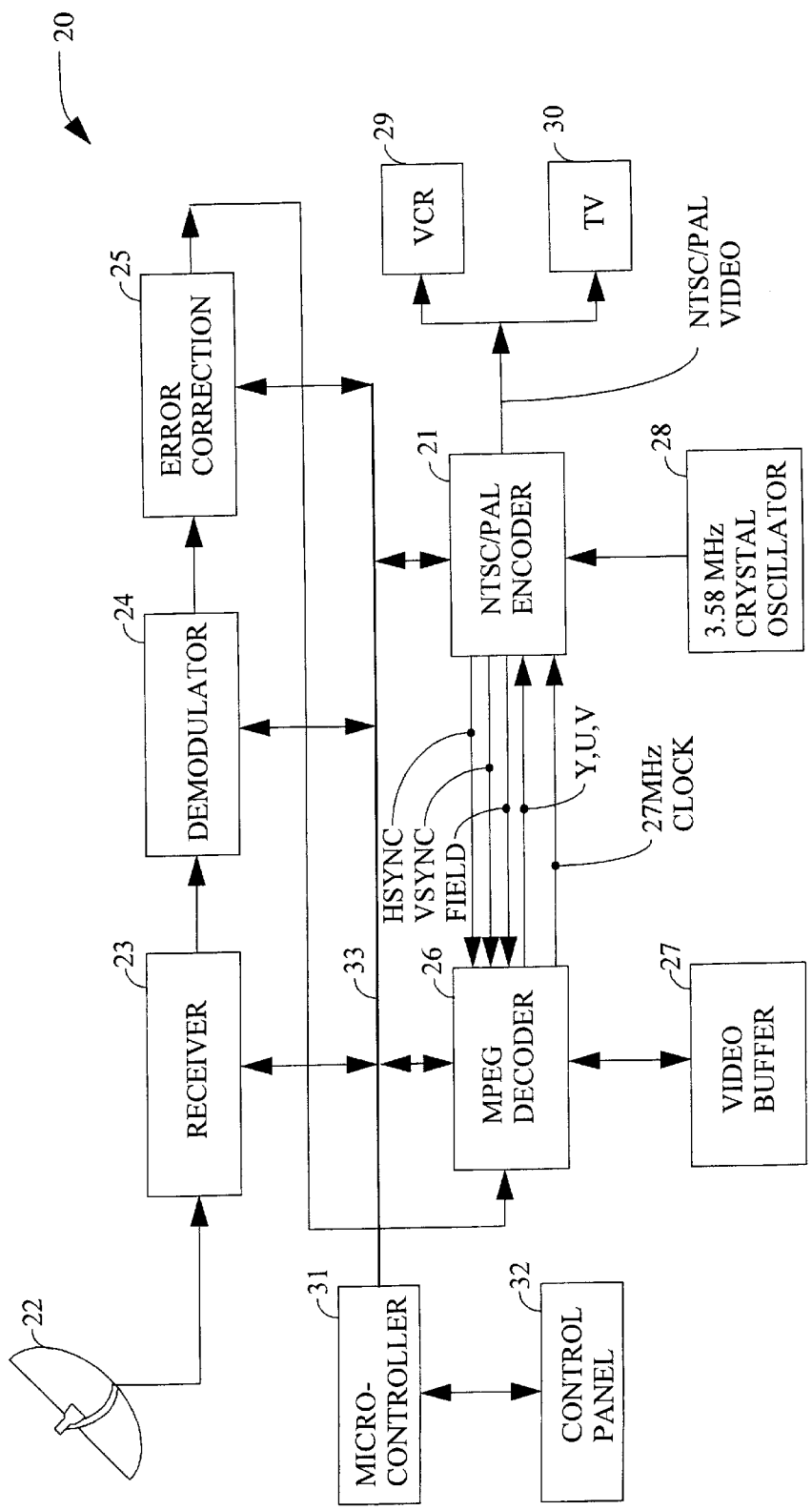
FIG. 1 is a block diagram of a direct broadcast satellite (DBS) TV receiver system including an NTSC/PAL encoder that incorporates the present invention.

While the invention is susceptible to various modifications and alternative forms, specific embodiments thereof have been shown in the drawings and will be described in detail. It should be understood, however, that it is not intended to limit the invention to the particular forms shown, but on the contrary, the intention is to cover all modifications, equivalents, and alternatives falling within the scope of the invention as defined by the appended claims.

DETAILED DESCRIPTION OF THE PREFERRED EMBODIMENT

Turning now to FIG. 1, there is shown a block diagram of a direct broadcast satellite (DBS) TV receiver system 20 including an NTSC/PAL encoder 21 that incorporates the present invention for generation and adjustment of a color subcarrier during the encoding of a composite NTSC/PAL video signal. A parabolic antenna 22 receives a microwave signal from a satellite (not shown) in a geosynchronous orbit above the earth. A receiver 23 selects a particular digital TV signal in the microwave signal, and converts the digital TV signal to a baseband signal. A demodulator 24 demodulates the baseband signal to recover a digital signal. Error correction circuits 25 employ error correction coding techniques to correct any errors in the digital signal.

An MPEG decoder 26 receives the error corrected digital signal and reconstructs a frame of digital video data in a video buffer 27. For example, the digital TV signal contains video data that has been compressed according to the MPEG2 standard so as to reduce the required microwave channel bandwidth for transmission of a high quality video signal. The reconstructed frame of video data has luminance (Y) and chrominance (U, V) pixels. The MPEG decoder transmits the luminance pixels (Y) at a 13.5 MHz rate, and transmits the chrominance pixels (U, V) at a rate of 6.75 MHz for each of the two chrominance components (U, V). The MPEG decoder also transmits a 27 MHz clock synchronized to the transmission of the luminance (Y) and chrominance (U, V) pixels.

The NTSC/PAL encoder 21 receives the 27 MHz clock and the luminance (Y) and chrominance (U, V) pixels from the MPEG decoder 26. The NTSC/PAL encoder 21 transmits a horizontal sync signal (HSYNC), a vertical sync signal (VSYNC) and a field sync signal (FIELD) to the MPEG decoder 26. The MPEG decoder 26 uses these synchronization signals to synchronize the transmission of the luminance (Y) and chrominance (U, V) pixels from the video buffer 27.

In accordance with the present invention, the NTSC/PAL encoder 21 uses a 3.58 MHz signal from a crystal oscillator to adjust a digitally synthesized digital color subcarrier signal. The NTSC/PAL encoder 21 modulates the digital color subcarrier signal by the chrominance (U, V) pixels to provide a modulated chrominance signal. The NTSC/PAL encoder 21 adds the modulated chrominance signal to the luminance pixels (Y) and inserts sync and blanking signals to form a digital composite NTSC/PAL video signal. The NTSC/PAL encoder 21 converts the digital composite NTSC/PAL video signal to analog form, and transmits the analog signal to a video-cassette recorder (VCR) 29 or to a television receiver (TV) 30.

The DBS receiver system 20 further includes a micro-controller 31 and a control panel 32. The micro-controller 31 is linked by a shared bus 33 to the receiver 23, the demodulator 24, the error correction circuits 25, the MPEG decoder 26, and the NTSC/PAL encoder. A user (not shown) operates the control panel 32 for selection of a desired digital TV signal. The micro-controller 31 responds to the user's selection by programming the receiver 23, demodulator 24, error correction circuits 25, MPEG decoder 26, and NTSC/PAL encoder for reception of the desired digital TV signal.

Figure 2:
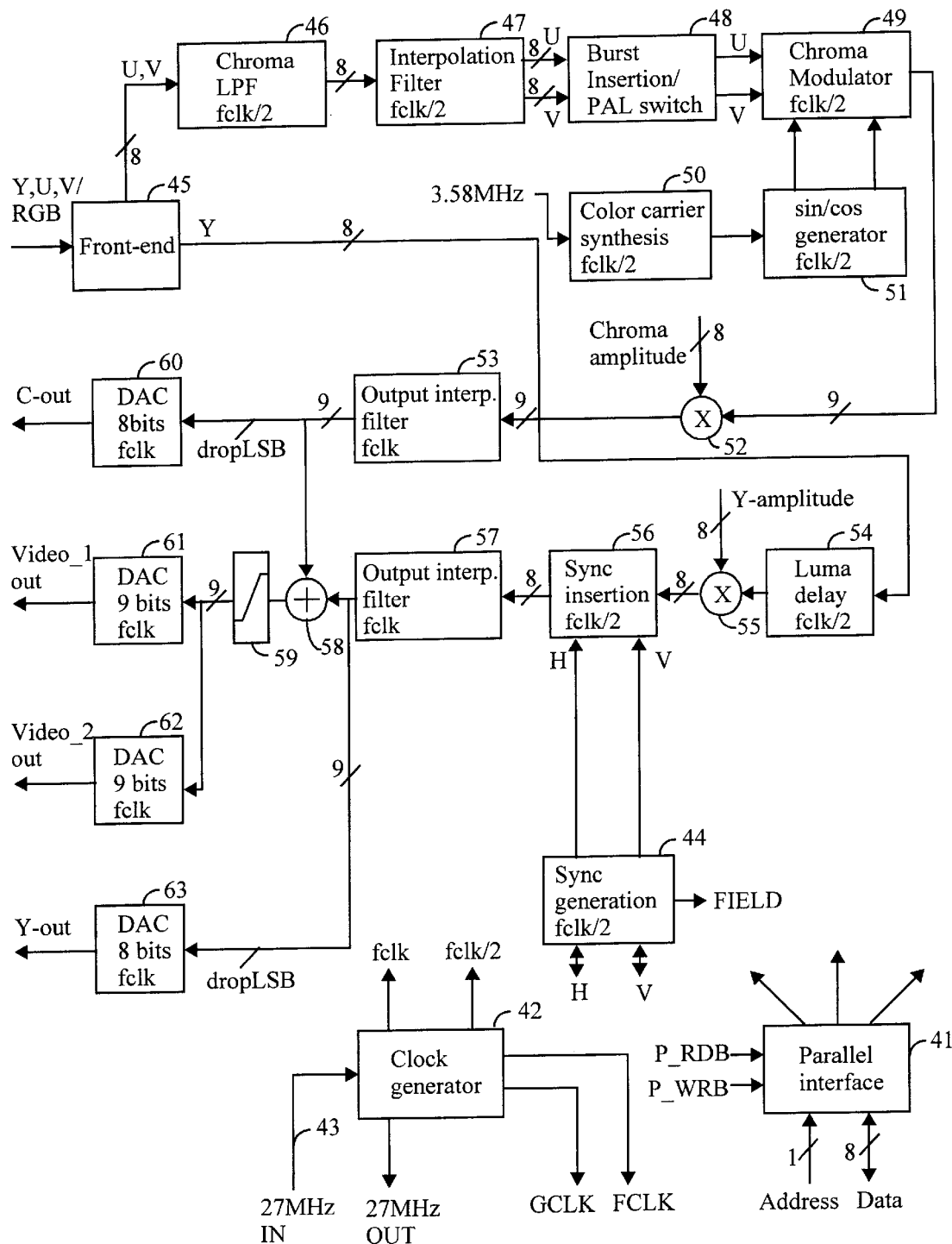
FIG. 2 is a block diagram of the NTSC/PAL encoder that incorporates the present invention.

Turning now to FIG. 2, there is shown a block diagram of the NTSC/PAL encoder 21. A multi-bit digital signal is indicated in this block diagram by a slash across a line for carrying the multi-bit digital signal, and the slash is labeled by a number, such as eight, indicating the number of bits in the multi-bit digital signal. Preferably the NTSC/PAL encoder 21 is a single-chip integrated circuit employing complementary metal-oxide semiconductor (CMOS) circuit elements.

The NTSC/PAL encoder is programmed by the micro-controller (31 of FIG. 1) via a parallel interface 41 for processing either NTSC formatted video signals or PAL formatted video signals. The parallel interface 41 also permits the micro-controller to select various features and operating parameters of the NTSC/PAL encoder 21, as will be further described below.

The NTSC/PAL encoder 21 has a clock generator 42 that receives a 27 MHz clock on an input line 43 from an external source (such as the MPEG decoder 26 in FIG. 1). The clock generator 42 generates two clock signals for internal use, a 27 MHz system clock (fclk) and a 13.5 MHz pixel clock (fclk/2). The clock generator 42 generates three clock signals for optional external use, including a symmetrical 27 MHz clock signal, a graphics clock (GCLK) at 13.5 MHz or 6.75 MHz, and a fast clock (FCLK) at 54 MHz.

The NTSC/PAL encoder 21 has sync generation circuits 44 that include a set of counters clocked by the 13.5 MHz pixel clock (fclk/2) for generating the horizontal sync (HSYNC), vertical sync (VSYNC) and field (FIELD) synchronization signals, and a number of other signals for controlling insertion of blanking and color burst signals into the composite NTSC/PAL video signal.

The NTSC/PAL encoder 21 has a front end 45 that accepts video data in either YUV or RGB format. In either case, the front end 45 converts the video data to 8-bits lumina (Y) and 8 bits multiplexed chroma (U, V). When accepting RGB data, the data are optionally passed through a gamma correction look-up table (γ=1/2.2) in the front end 45 to provide corrected values R', G', B', and then the corrected values are transformed to Y, U, V format by nine shift-add multipliers in the front end 45 which perform the following computations:

$$Y = \frac{5}{16}R' + \frac{5}{8}G' + \frac{1}{8}B'$$

$$U = \frac{-5}{32}R' + \frac{-5}{16}G' + \frac{1}{2}B'$$

$$V = \frac{33}{64}R' + \frac{-7}{16}G' + \frac{-65}{512}B'$$

The multiplexed chroma (U, V) from the front-end 45 is filtered in a chroma low-pass filter (LPF) 46 and up-sampled from a 6.75 MHz rate to a 13.5 MHz rate in an interpolation filter 47. The chroma signals (U, V) are demultiplexed from the interpolation filter 47, and burst insertion circuits 48 insert color burst signals into the demultiplexed chroma signals U and V. A chroma modulator 49 modulates digital sine and cosine color subcarrier signals by the respective chroma signals U and V from the burst insertion circuits 48.

To generate the digital sine and cosine color subcarrier signals, the NTSC/PAL encoder 21 receives an analog reference frequency signal from an external quartz crystal. For NTSC operation, this analog reference frequency signal should be at 3.5795455 MHz±5 Hz, or about 3.58 MHz. For PAL operation, this analog reference frequency signal should be 4.43361875 MHz±5 Hz. In accordance with the present invention, color carrier synthesis circuits 50 synthesize a digital signal from this analog reference frequency signal, and sine/cosine generator circuits 51 generate the digital sine and cosine color subcarrier signals from the synthesized digital signal.

The modulated chroma signal from the chroma modulator 49 is adjusted in a multiplier 52 by a programmed chroma amplitude value, and then up-sampled by a factor of two in an output interpolation filter 53.

The luminance signal (Y) from the front-end 45 is passed though an adjustable luma delay line 54 to compensate for delay due to processing of the chroma signal through the chroma LPF 46 and interpolation filter 47. A multiplier 55 adjusts the amplitude of the luminance signal (Y) by a programmed luminance amplitude value. Sync insertion circuits 56 insert horizontal and vertical synchronization and blanking signals into the adjusted luminance signal (Y), and this composite luminance signal is up-sampled by a factor of two in an output interpolation filter 57. An adder 58 forms a composite video signal by adding the composite luminance signal from the output interpolation filter 57 to the modulated chroma signal from the output interpolation filter 53. A limiter 59 limits this composite video signal to nine bits.

The NTSC/PAL encoder includes four video digital-to-analog (D/A) converters 60, 61, 62 and 63. The D/A converters 60 and 63 have eight-bit accuracy for providing respective chroma and luma signals. The D/A converters 61 and 62 have nine-bit accuracy for providing composite video signals to a 75 ohm load and to a 37.5 ohm load, respectively.

Figure 3:
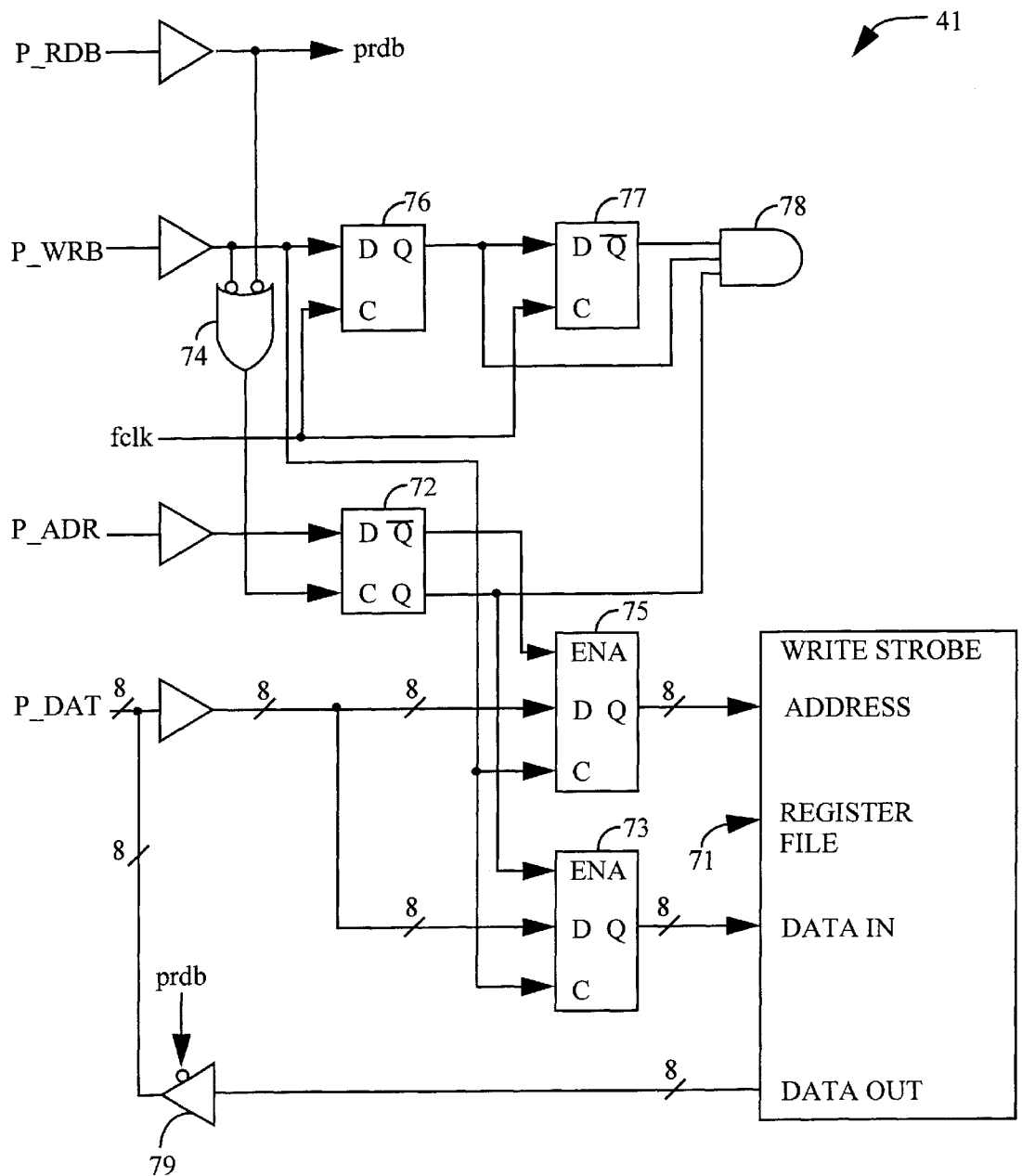
FIG. 3 is a schematic diagram of a parallel interface in the NTSC/PAL encoder of FIG. 2.

Turning now to FIG. 3, there is shown a schematic diagram of the parallel interface 41. The parallel interface 41 uses signals P_RDB (parallel read), P_WRB (parallel write), P_ADR and P_DAT(7:0) (8-bit parallel register address or data). P_RDB and P_WRB are active low signals. Internal registers logically organized as a register file 71 are only accessed if either P_RDB or P_WRB is low. P_RDB and P_WRB must not be active (low) at the same time.

The P_ADR signal is latched in a flip-flop 72 with the falling edge of either P_RDB (read) or P_WRB (write). In the case of a read operation (P_RDB active low), the data on the P_DAT bus is latched by the micro-controller (31 in FIG. 1) at the rising edge of the P_RDB signal. In the case of a write operation (P_WRB active low), the data is latched in a register 73 at the rising edge of the P_WRB signal.

If P_ADR is low the value on the P_DAT bus is interpreted as the register address. If P_ADR is high the value on the P_DAT bus is interpreted as data. A complete data transfer consists of either 2 write cycles (register address and data) or a write and a read cycle. For example, for a write operation, the micro-controller (31 in FIG. 1) asserts the register address on P_DAT(7:0), sets P_ADR low, and then asserts an active low pulse on P_WRB. The flip-flop 92 is clocked via a NAND gate 74 to the low state of P_ADR, enabling an address register 75 to receive the register address from P_DAT(7:0) on the rising edge of the P_WRB signal. Then the micro-controller (31 in FIG. 1) asserts the data onto P_DAT(7:0), sets P_ADR high, and then asserts an active low pulse on P_WRB. The flip-flop 72 is clocked via the NAND gate 74 to the high state of P_ADR, enabling a register 73 to receive the data from P_DAT(7:0) on the rising edge of the P_WRB signal. Moreover, flip-flops 76, 77 and an AND gate 78 generate a write strobe pulse applied to the register file so that the data in the register 73 is written into the addressed register in the register file 71. In a similar fashion, the micro-controller can read a register in the register file 71 by first writing the register address to the register 75, and then asserting P_RDB active low so that a tri-state gate 79 asserts data from the addressed register in the register file 71 onto P_DAT(7:0).

Figure 4:
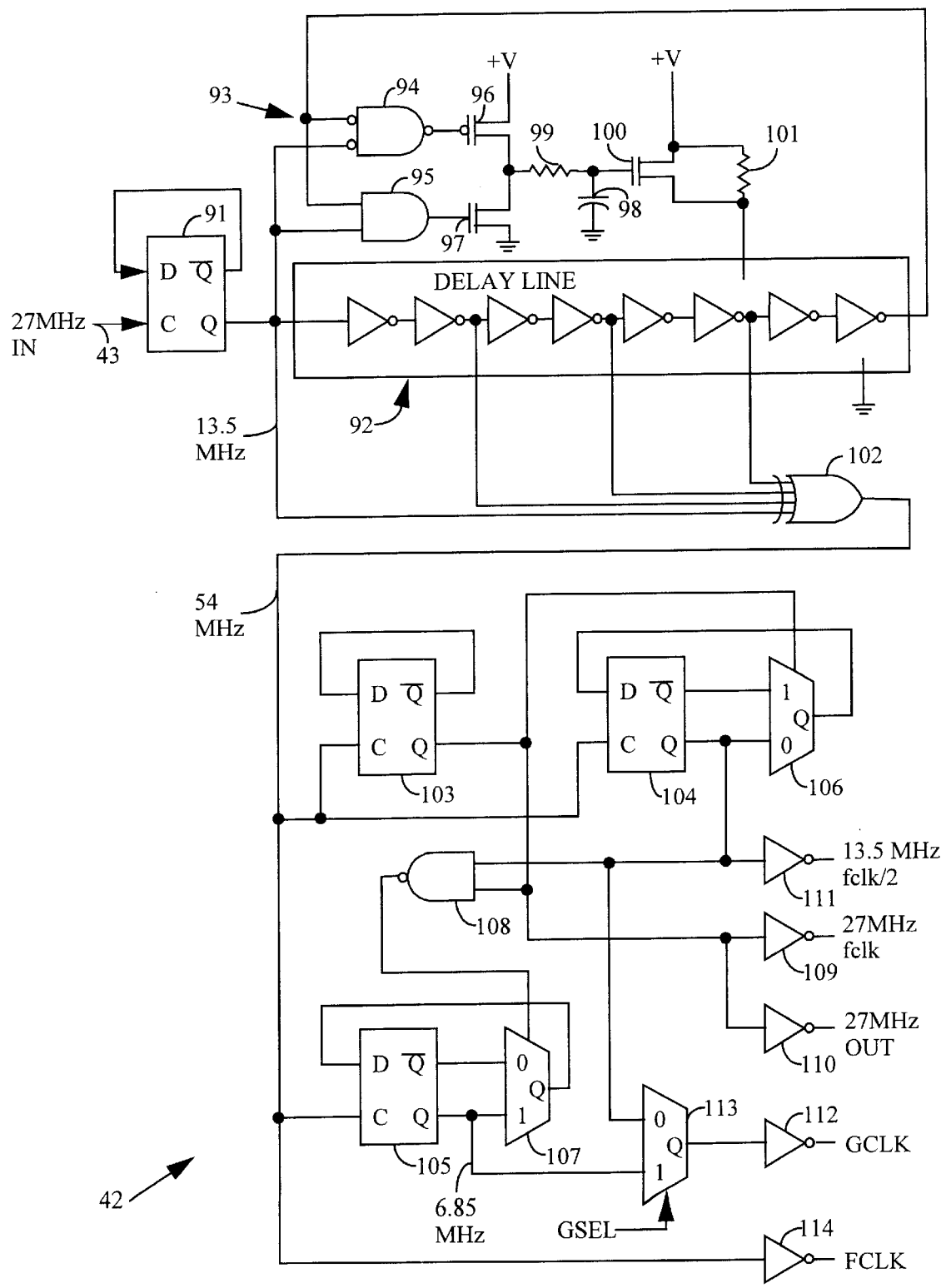
FIG. 4 is a schematic diagram of a clock generator in the NTSC/PAL encoder of FIG. 2.

Turning now to FIG. 4, there is shown a schematic diagram of the clock generator 42. The clock generator 42 has a flip-flop 91 clocked by the external 27 MHz signal on the input line 43 to generate a 13.5 MHz clock signal having a 50% duty cycle. The 13.5 MHz clock signal is delayed by one period of the 27 MHz signal in a delay line 92 connected to a phase detector 93 to provide a delay-locked loop. The phase detector 93 includes an OR gate 94 and AND gate 95 which detect a lead or a lag, respectively, of the delayed signal by more than one period of the 27 MHz signal on the input line 43. The OR gate 94 controls a P-channel IGFET 96, and the AND gate 95 controls an N-channel IGFET 97, in order to charge or discharge a capacitor 98 through a resistor 99. When the delay through the delay line 93 is greater than one period at the 27 MHz frequency of the input signal on line 43, then the gate 94 turns on the P-channel IGFET 56 in order to charge the capacitor 98.

When the delay through the delay line 92 is less than one period at the 27 MHz frequency of the signal on the input line 43, then the gate 95 turns on the N-channel IGFET 57 to discharge the capacitor 98. The voltage on the capacitor 98 controls an N-channel IGFET 100 in a source follower configuration supplying in part the current to the delay line 92. When the N-channel IGFET 100 is in an off state, a resistor 101 supplies a minimum amount of current sufficient for the delay line 92 to have a delay somewhat more than 1 and less than 2 periods of the 27 MHz signal on the input line 43. When the capacitor 98 becomes fully charged, the N-channel IGFET 100 is turned on sufficiently so that the delay through the delay line 92 is less than one period of the 27 MHz signal on the input line 43. Therefore, the phase detector 93 will adjust the voltage on the capacitor 98 so that the delay through the delay line 92 is approximately equal to one period of the 27 MHz signal on the input line 43.

The delay line 92 has three intermediate taps providing the 13.5 MHz signal from the flip-flop 91 delayed by ¼, ½ and ¾ of the period of the 27 MHz signal on the input line 43. The 13.5 MHz signal from the flip-flop 91 and the three signals from the three intermediate taps of the delay line 92 are combined in an exclusive-OR gate 102 to generate a 54 MHz signal. This 54 MHz signal clocks three flip-flops 103, 104 and 105 in a synchronous binary divider circuit which further includes a first multiplexer 106, a second multiplexer 107, and a NAND gate 108. The first flip-flop 103 provides a symmetrical 27 MHz signal which is buffered by an inverter 109 to provide the internal 27 MHz system clock (fclk) and is buffered by an inverter 110 to provide the 27 MHz output clock. The second flip-flop 104 generates a 13.5 MHz clock which is buffered by an inverter 111 to provide the internal 13.5 MHz pixel clock (fclk/2). The third flip-flop 105 provides a 6.75 MHz clock which is received in a multiplexer 113 which also receives the 13.5 MHz clock from the second flip-flop 104. The multiplexer 113 receives a graphics selection signal (GSEL) from the parallel interface (41 in FIG. 2). The multiplexer 113 selects either the 6.75 MHz signal or the 13.5 MHz to provide a graphics clock which is buffered by an inverter 112 providing the output graphics clock (GCLK). The 54 MHz signal from the exclusive-OR gate 102 is buffered by an inverter 114 to provide the fast clock (FCLK).

Figure 5:
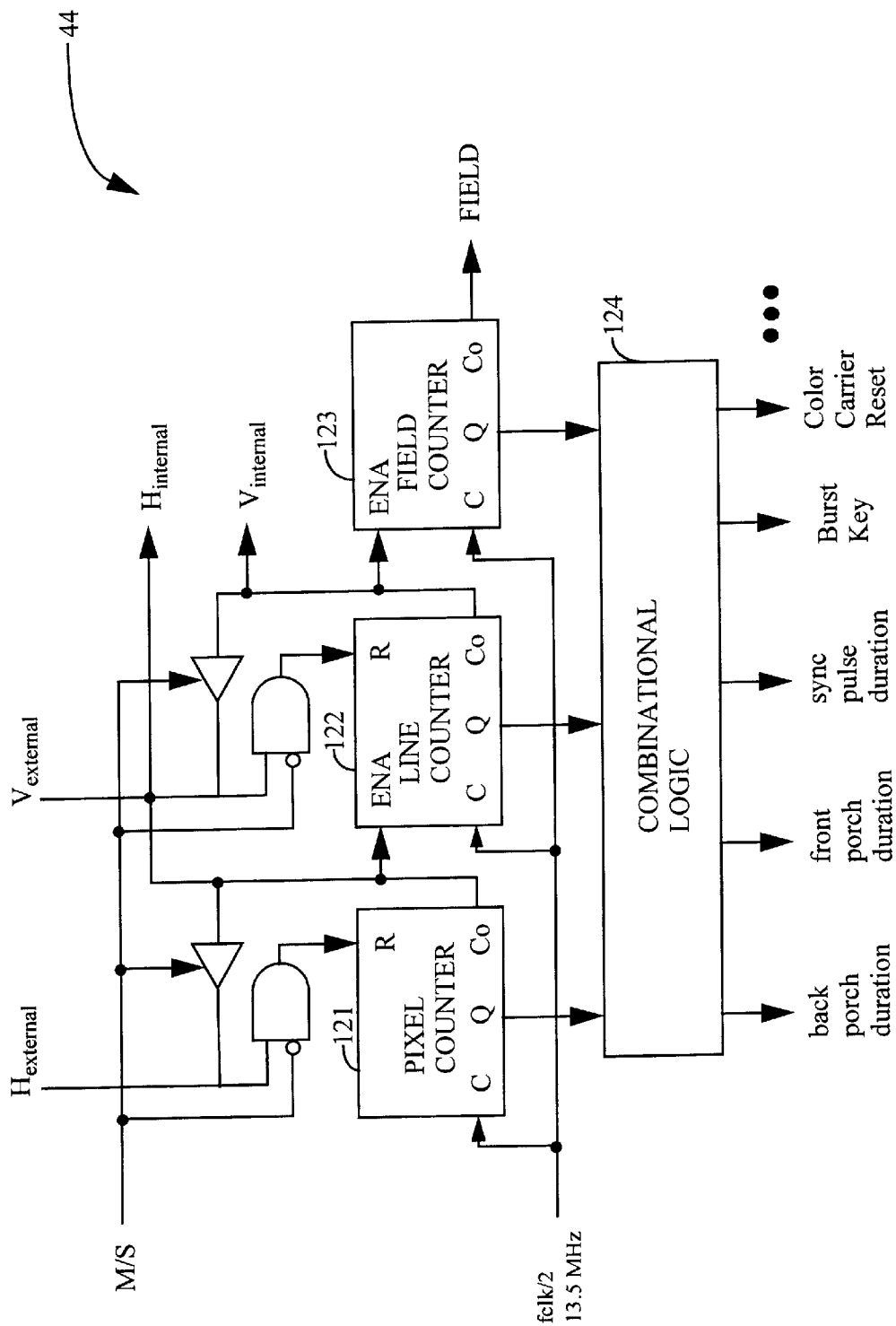
FIG. 5 is a block diagram of sync generation circuits in the NTSC/PAL encoder of FIG. 2.

Turning now to FIG. 5, there is shown a block diagram of the sync generation circuits 44. The sync generation circuits 44 include a pixel counter 121, a line counter 122, and a field counter 123. The sync generation circuits can be programmed via a master/slave signal (M/S) from the parallel interface (41 in FIG. 2) to operate in a master mode, in which the sync generation circuits generate the external H and V sync signals, or in a slave mode, in which the pixel counter 121 and the line counter 122 are synchronized to external H and V sync signals, respectively. The counts in the pixel counter 121, line counter 122, and field counter 123 define a current pixel position in a video frame. The pixel counter 121 counts 858 pixels per line for NTSC and 864 pixels per line for PAL, at the 13.5 MHz clocking rate. The line counter 122 and the field counter 123 will count 525 scan lines (NTSC) or 625 scan lines (PAL) per frame, 2:1 interlaced. These counts are decoded by combinational logic 124 to generate various timing signals used for generating the composite NTSC/PAL video signal, such as timing signals defining the back porch duration, front porch duration, sync pulse duration, burst key, and color carrier generator reset. These timing signals will be further described below with reference to FIGS. 11, 15 and 16.

Figure 6:
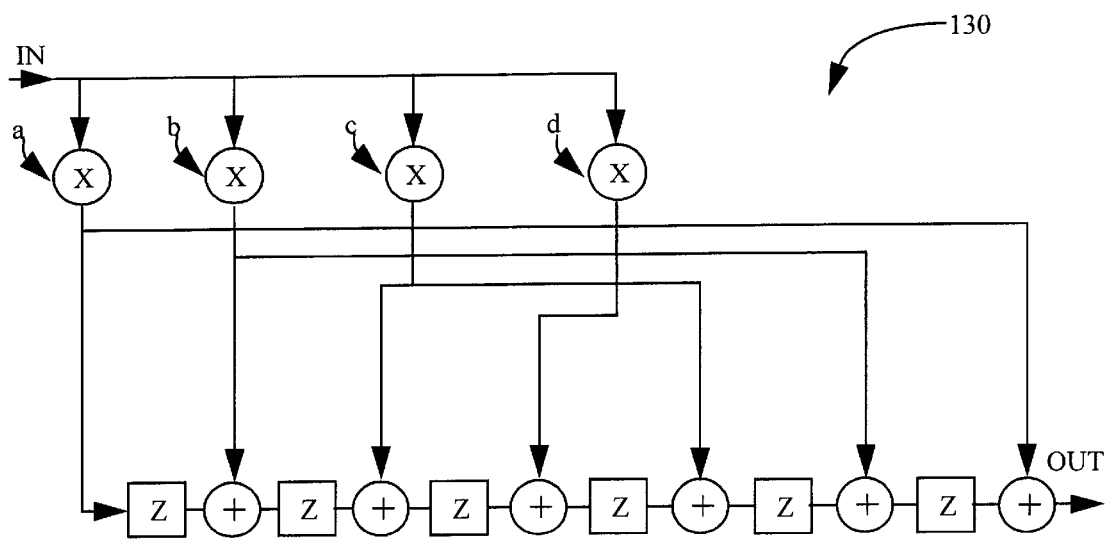
FIG. 6 is a block diagram of a transposed symmetrical digital filter architecture in the NTSC/PAL encoder of FIG. 2.

Turning now to FIG. 6, there is shown a block diagram illustrating a transposed symmetrical digital filter architecture 130. This is the preferred architecture for the chroma LPF 46 and the other digital FIR filters in the NTSC/PAL encoder 21. The transposed symmetrical architecture minimizes the number of multipliers and minimizes the critical path to one multiplier and adder stage. In FIG. 6, the multipliers are shown as circles labeled "X", and the adders are sown as circles labeled "+". The boxes labeled "Z" are registers. The architecture 130 shown in FIG. 6 effectively has seven taps and seven respective symmetrical coefficients having four distinct values. The four distinct values are labeled a, b, c and d in FIG. 6.

The chroma LPF 46 in FIG. 2 is a FIR digital filter clocked with fclk/2. The passband extends to about 1.3 MHz. The passband ripple is less or equal to 0.05 dB. The 3 dB point is at about 1.5 MHz. The stopband begins at 3 MHz with an attenuation of greater or equal to 35 dB. The filter 46 can optionally be bypassed by the micro-controller (31 in FIG. 1) clearing a certain bit in a control register in the register file (71 in FIG. 3). This bypass technique uses an output multiplexer and delay compensating registers in the bypass path in a fashion analogous to the filter structure shown in FIG. 18, which is further described below.

The chroma LPF 46 has 19 taps and uses symmetrical fixed coefficients. The fixed coefficients are always 8 bits wide (including the sign bit). The following table shows the fixed coefficient values.

| Filter Coefficients | Value   | Binary Value |
| ------------------- | ------- | ------------ |
| Tap 1, 19           | +1/128  | 0000 0001    |
| Tap 2, 18           | +1/128  | 0000 0001    |
| Tap 3, 17           | 0       | 0000 0000    |
| Tap 4, 16           | −2/128  | 1111 1110    |
| Tap 5, 15           | −5/128  | 1111 1011    |
| Tap 6, 14           | −4/128  | 1111 1100    |
| Tap 7, 13           | +4/128  | 0000 0100    |
| Tap 8, 12           | +18/128 | 0001 0010    |
| Tap 9, 11           | +32/128 | 0010 0000    |
| Tap 10              | +38/128 | 0010 0110    |

10-bit adders are used in the final adder stages to guarantee that no overflow or underflow occurs. After the final addition, the final value is clipped and rounded (unbiased away from zero) in order to reduce the signal back to ±128.

For MPEG2 (CCIR601 standard) the chroma pixels are spatially located at the same positions as every odd numbered luma pixel. The input to the chroma LPF 46 is a stream of U and V samples. The V samples are delayed by one fclk/2 period and alternated with the V samples when passing through the chroma LPF. Each delay element (Z) in the chroma LPF 46 consists of two registers connected in series so that the adders and multipliers in the chroma LPF 46 perform computations upon either U samples or V samples during each alternate fclk/2 cycle.

Figure 7:
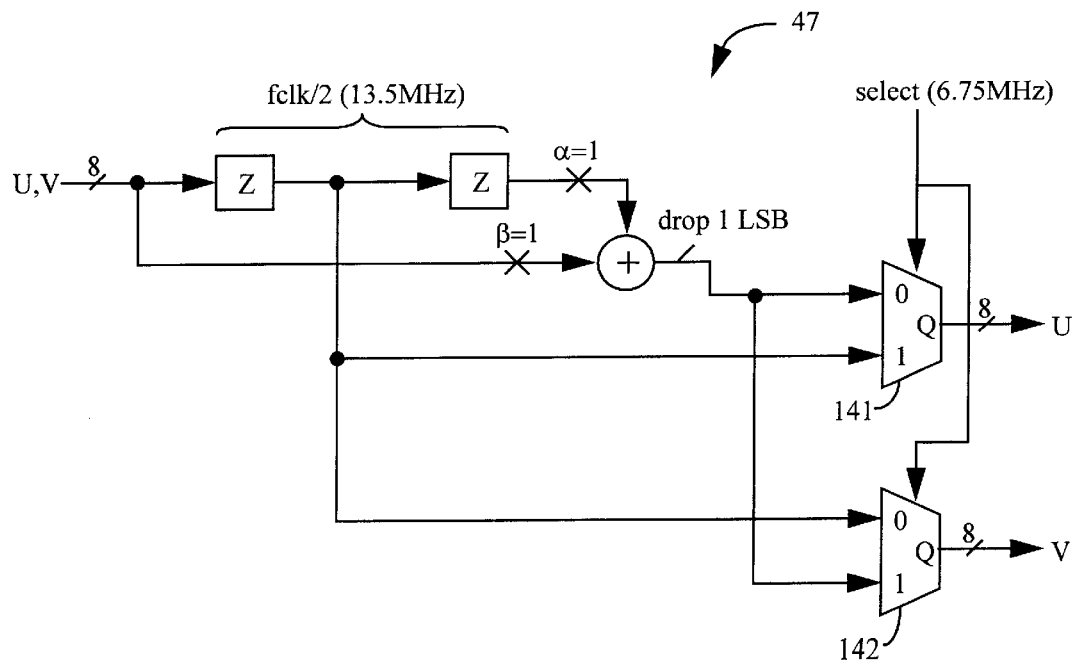
FIG. 7 is a schematic diagram of a chroma interpolation filter 47 in the NTSC/PAL encoder of FIG. 2.

Turning now to FIG. 7, there is shown a schematic diagram of the chroma interpolation filter 47 that is used to upsample the MPEG2 chroma information (U, V) from a 6.75 MHz rate for each of the U and V samples to a 13.5 MHz rate. The transfer function is as follows:

$$H(z) = \tfrac{1}{2}x(\alpha x z^{-1} + \beta x z)$$

The original chroma values pass through unchanged. The interpolated chroma samples are averaged from the two next neighboring samples ($\alpha = \beta = 1$). A pair of multiplexers 141, 142 switching at a rate of 6.75 MHz (one half of the pixel frequency fclk/2) provide the demultiplexed U and V chroma values.

Figure 8:
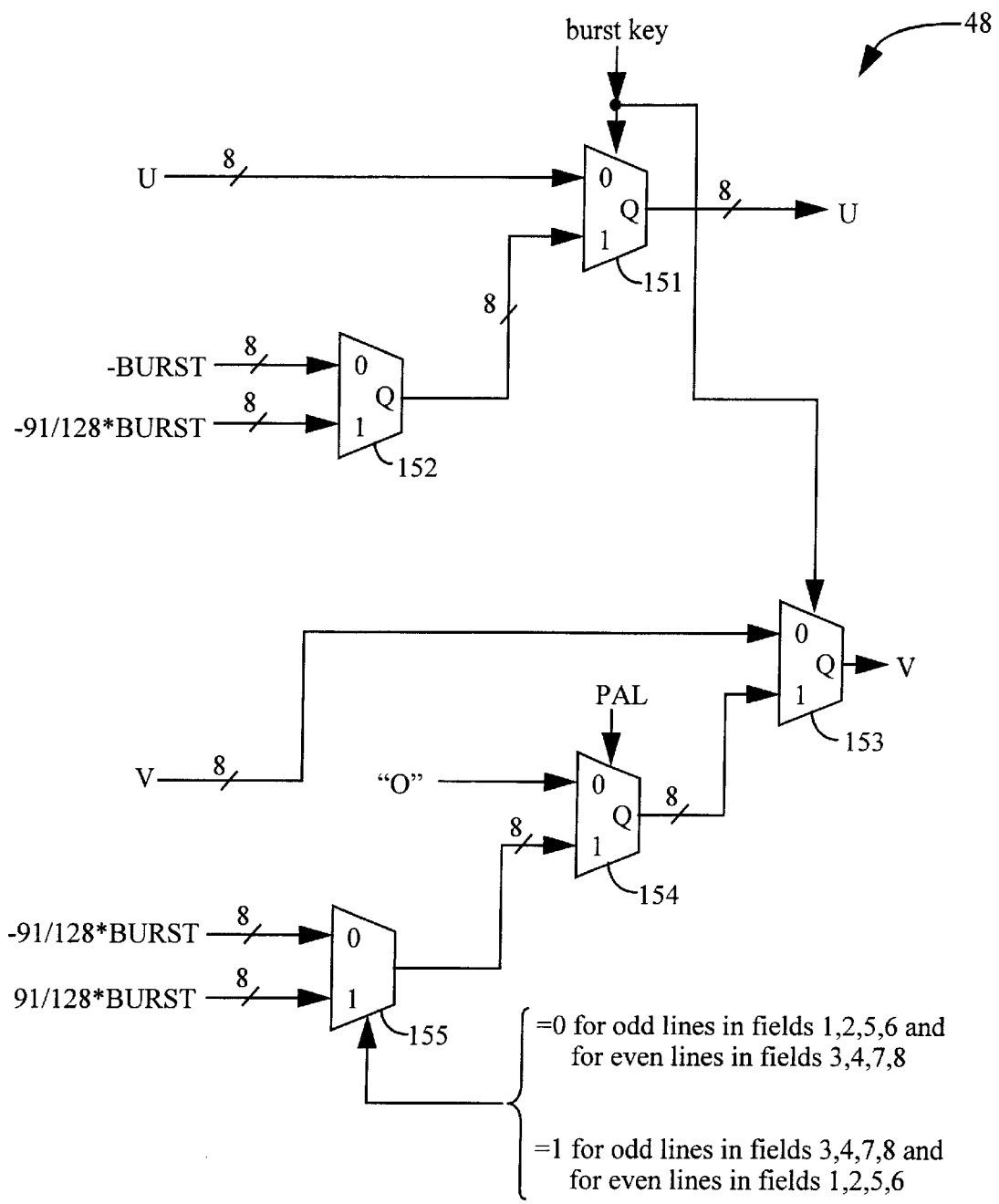
FIG. 8 is a schematic diagram of burst insertion and PAL switching circuits in the NTSC/PAL encoder of FIG. 2.

Turning now to FIG. 8, there is shown a schematic diagram of the burst insertion and PAL switch circuits 48. Burst insertion and PAL burst polarity switching is performed by five multiplexers 151, 152, 153, 154 and 155. The value BURST is a constant setting the amplitude of the color subcarrier burst. The control signal "burst key" is generated from the sync generation circuits (56 in FIG. 2) and is active for the duration of the color subcarrier burst. Burst insertion in PAL is handled differently from NTSC. In NTSC the burst is only added to the U portion of the chroma signal, whereas in PAL the burst is added to the U and the V portions of the chroma signal. The factor 91/128 (~1/sqrt(2)) in PAL comes from the fact that the phase is 45 degrees off the U and V axes. In PAL, the polarity of the burst along the V axis is switched at each line by the multiplexer 155, so the phase changes between +135 and −135 degrees from line to line. The polarity is negative for odd lines in fields 1, 2, 5, and 6, and for even lines in fields 3, 4, 7, and 8. The polarity is positive for odd lines in fields 3, 4, 7, and 8, and for even lines in fields 1, 2, 5, and 6. The selection signal to the multipexer 155 is provided by the sync generation circuits (44 in FIG. 2).

Figure 9:
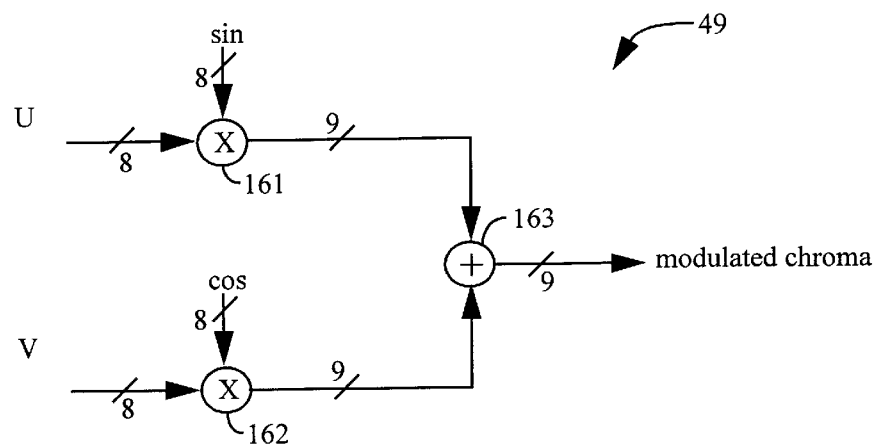
FIG. 9 is a schematic diagram of a chroma modulator in the NTSC/PAL encoder of FIG. 2.

Turning now to FIG. 9, there is shown a schematic diagram of the chroma modulator 49. The chroma modulator includes an 8-bit multiplier 161 for computing the product of the U sample and the digital sine value, an 8-bit multiplier 162 for computing the product of the V sample and the digital cosine value, and a 9-bit adder 163 for summing the products from the two multipliers 161 and 162 to compute a modulated chroma sample.

Figure 10:
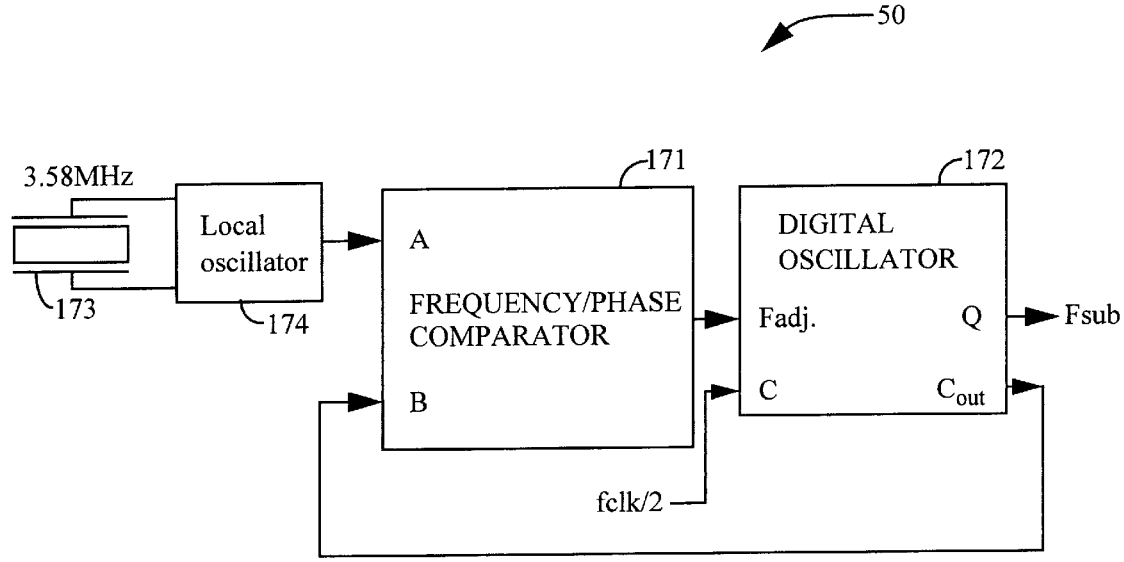
FIG. 10 is a block diagram of color carrier synthesis circuits which use the present invention in the NTSC/PAL encoder of FIG. 2.

Turning now to FIG. 10, there is shown a block diagram of the color carrier synthesis circuits 50. The color carrier synthesis circuits 50 generate a digital color subcarrier signal at a sampling rate defined by the system clock of the NTSC/PAL encoder. The frequency of the digital color subcarrier signal, however, is generally asynchronous with respect to the system clock of the NTSC/PAL encoder. In particular, MPEG2 specifies a system clock of 27 MHz with a relatively large tolerance of ±1350 Hz, and the NTSC/PAL encoder uses the MPEG2 system clock so as to directly process the pixels from the MPEG decoder 26 without any need for rate conversion circuitry such as a FIFO buffer or an interpolation-decimation circuit. The frequency of the digital color subcarrier signal, however, must be relatively stable (±5 Hz) to conform with the specified tolerance of the NTSC and PAL standards, and to ensure that VCRs and television receivers designed according to the NTSC and PAL standards will process the composite video signal from the NTSC/PAL encoder without significant degradation in picture quality. The frequency of the digital color subcarrier signal can be generated with the required precision by a conventional quartz crystal 173 and a local oscillator circuit 174 supplying an analog signal asynchronous with respect to the system clock (fclk/2).

In a preferred embodiment of the present invention, the color carrier synthesis circuits 50 periodically generate a number (Fsub) representing the color subcarrier phase in response to the analog signal from the local oscillator 174 defining the frequency of the signal represented by the time series of values of the number (Fsub). The values of the number (Fsub) are generated at the rate of the digital system clock (fclk/2) supplied to the digital oscillator 172. The frequency of the digital oscillator (i.e., the time rate of change of phase represented by the number Fsub) is adjusted in response to a control signal (Fadj) from a frequency/phase comparator 171 that compares the frequency of the analog signal to the frequency of the digital oscillator 172. The frequency of the digital oscillator 172, for example, is indicated by a carry out signal (Cout) asserted for one cycle of the digital clock (fclk) at a certain phase or phase interval of the digital oscillator 172 Alternatively, the frequency/ phase comparator 171 could compare the phase of the analog signal to the phase of the digital oscillator 172. In either case, the frequency/phase comparator 171 adjusts the frequency of the digital oscillator 172 so that the frequency of the signal (Fsub) is specified by the frequency of the analog signal from the local oscillator 174, despite substantial changes in the frequency of the digital clock (fclk/2). In a specific embodiment, the frequency/phase comparator 171 includes an up/down counter counting up on cycles of the local oscillator 171 and counting down on cycles of the digital oscillator 172, and the digital oscillator 172 is an accumulator circuit.

Figure 11:
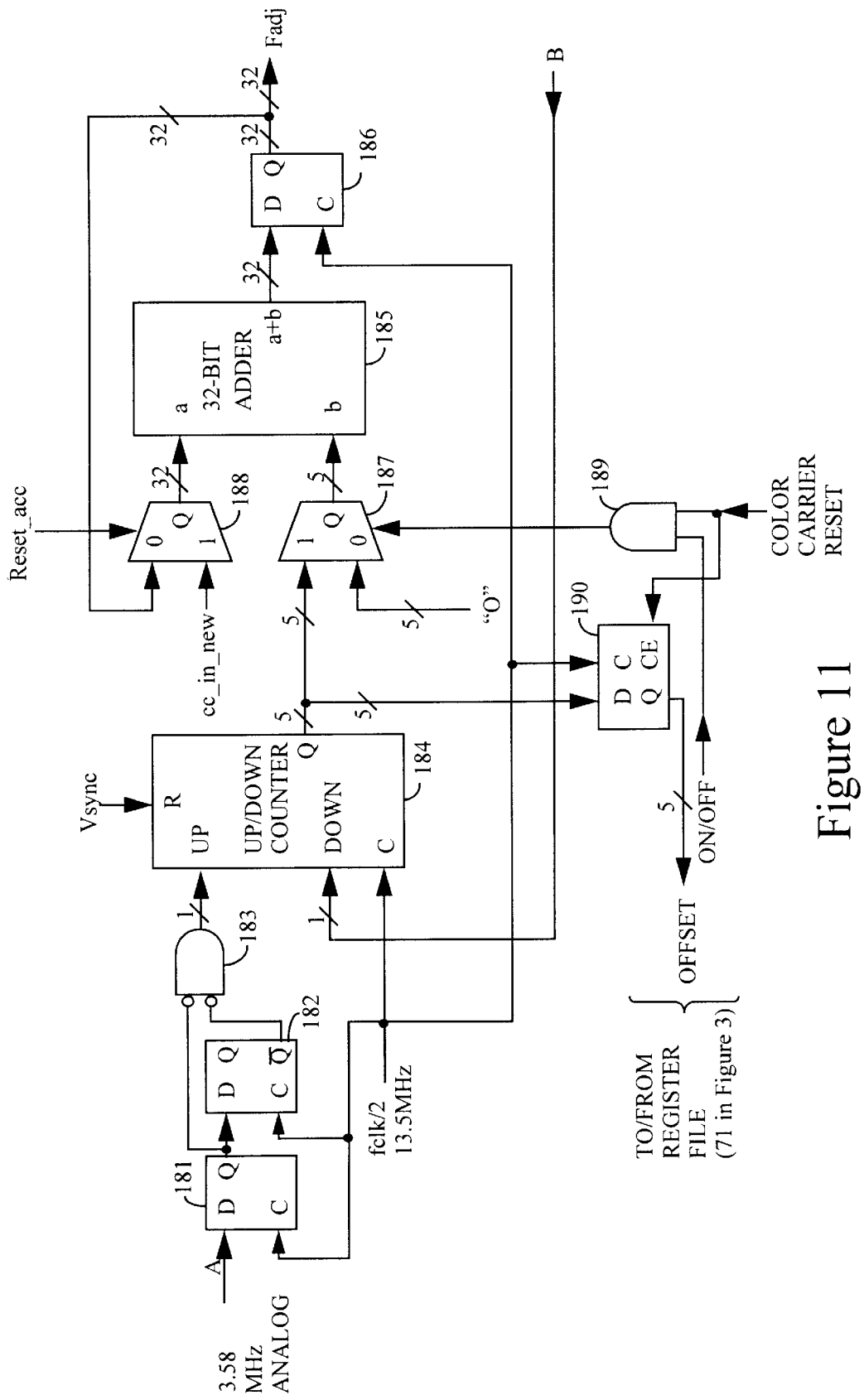
FIG. 11 is a schematic diagram of a preferred circuit for a frequency/phase comparator used in the color carrier synthesis circuits of FIG. 10.

Turning now to FIG. 11, there is shown a schematic diagram of a preferred circuit for the frequency/phase comparator 171. The 3.58 MHz analog signal applied to the input A (by the local oscillator 174 in FIG. 10) is synchronized in a first D-type flip-flop 181, and a single pulse is generated by a second flip-flop 182 and a NOR gate 183 for each cycle of the 3.58 MHz signal. The pulses from the NOR gate 183 are applied to an UP input of a five-bit up/down counter 184, and pulses on the input B (from the carry-out of the digital oscillator 172 in FIG. 10) are applied to a DOWN input of the up-down counter 184.

So that the frequency of the color subcarrier will change only during the vertical blanking interval and not cause a noticeable shift in hue in the video field, the output of the up-down counter is not directly applied to the digital oscillator (172 in FIG. 10). Instead, the output of the up-down counter 184 is added to an accumulated value just prior to the vertical sync pulse (Vsync) so that the accumulated value adjusts the frequency of the digital oscillator during the vertical sync pulse. As shown in FIG. 11, the accumulated value is computed by a 32-bit adder 185 and stored in a 32-bit register 186. A first multiplexer 187 is responsive to the color carrier reset signal (from the sync generation circuits 44 in FIG. 2) which is asserted just prior to the vertical sync pulse (Vsync) to add the output of the up-down counter 184 to the accumulated value.

A second multiplexer 188 feeds back either the value of the register 186 or an initial value (cc_in_new) when a reset signal (Reset_acc) is asserted, so long as frequency adjustment is enabled by a gate 189 controlled by an ON/OFF signal. The initial value is supplied by a register in the register file (71 of FIG. 3), and this register is programmed by the micro-controller (31 of FIG. 1) to have the initial value (cc_in_new) corresponding to the desired NTSC or PAL color subcarrier frequency. The reset signal (Reset_acc) is asserted during a system reset, and whenever a new value of cc_in_new is loaded or programmed into its respective register in the register file (71 of FIG. 3). When the accumulator register 186 has been loaded with the initial value, the frequency of the digital oscillator 172 becomes adjusted sufficiently close to the 3.58 MHz signal so that the 5-bit up/down counter 184 will not overrun nor underrun during the time interval between the vertical sync pulses (Vsync). It is desirable to ensure that overrun and underrun of the counter 184 will not occur to guarantee that the frequency of the digital oscillator (172 in FIG. 10) will track the frequency of the 3.58 MHz analog input (A).

If the circuit of FIG. 11 were used in another application, then the bit-width of the up/down counter 184 should be selected to prevent underrun or overrun depending on the variation in the frequencies of the signals being compared by the up/down counter. Alternatively, the up/down counter could be provided with additional combinational logic preventing underrun or overrun; for example, the UP input of the counter could be inhibited by a gate when the counter is at a maximum value (for example, when the most significant counter bit is a logic zero and the other counter bits are logic ones), and the DOWN input of the counter could be inhibited by a gate when the counter is at a minimum value (for example, when the most significant counter bit is a logic one and the other counter bits are logic zeros).

The bit-width of the up/down counter 184 could also be increased to permit the color carrier synthesizer (50 in FIG. 10) to more quickly adjust to a change in frequency resulting from either a shift in the system clock frequency or a newly programmed value for cc_in_new. For example, the bit-width of the up/down counter 184 could be increased to twelve bits. This increase in bit-width would also relax the required tolerance on the system clock frequency and permit a wider range of programmed values for cc_in_new.

The ON/OFF signal in FIG. 11 is provided by a bit in a control register of the register file (71 in FIG. 3) permitting the micro-controller (31 in FIG. 1) to enable or disable the frequency adjustment circuits. By enabling the adjustment circuits only when the system clock deviates from its desired value by more than a certain threshold, it is possible to substantially eliminate the adjustment process from causing jitter in the instantaneous frequency of the synthesized carrier. Of course, there is always some jitter caused by the finite precision arithmetic of the digital oscillator (172 in FIG. 12) when the system clock frequency (fclk/2) and the synthesized frequency do not have an integer relationship. To permit the micro-controller to sense the deviation of the system clock from its desired value, the frequency deviation sensed by the frequency comparator circuits 171 is strobed in a register 190 having a data input receiving the data output of the up/down counter 184 when the color carrier reset signal is asserted. The micro-controller can read the contents of the register 190 by accessing the parallel interface (41 in FIG. 2) to address the contents of the register 190 in register file (71 in FIG. 3).

Figure 12:
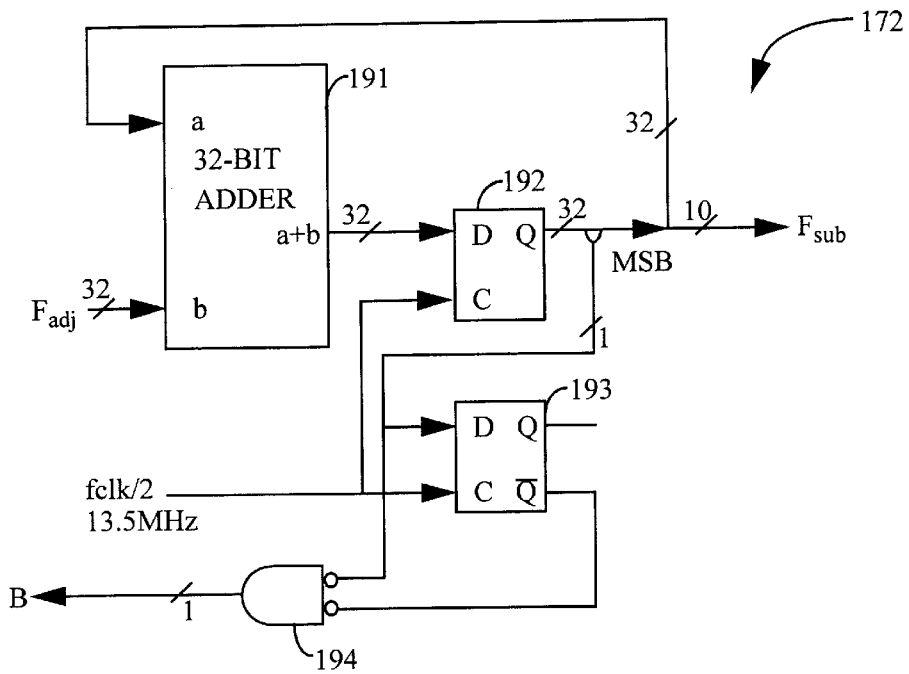
FIG. 12 is a schematic diagram of a preferred circuit for the digital oscillator used in the color carrier synthesis circuits of FIG. 10.

Turning now to FIG. 12, there is shown a schematic diagram of a preferred circuit for the digital oscillator 172. The digital oscillator includes a 32-bit adder 191 and a 32-bit register 192 which together function as an accumulator that is incremented by the frequency adjustment values (Fadj) from the frequency/phase comparator 171 of FIG. 11. A D-type flip-flop 193 and a NOR gate 194 provide one carry-out pulse during each cycle of the digital oscillator signal (Fsub). The carry-out pulse occurs when the most-significant bit (MSB) of the digital oscillator signal changes from a logic one to a zero. The adjustment value (Fadj) for obtaining a desired color subcarrier frequency is related to the accumulator clocking rate (fclk/2) and the number (n=32) of bits in the accumulator according to:

$$Fadj = \frac{(\text{subcarrier frequency})(2°)}{(\text{accumulator clocking rate})}$$

Figure 13:
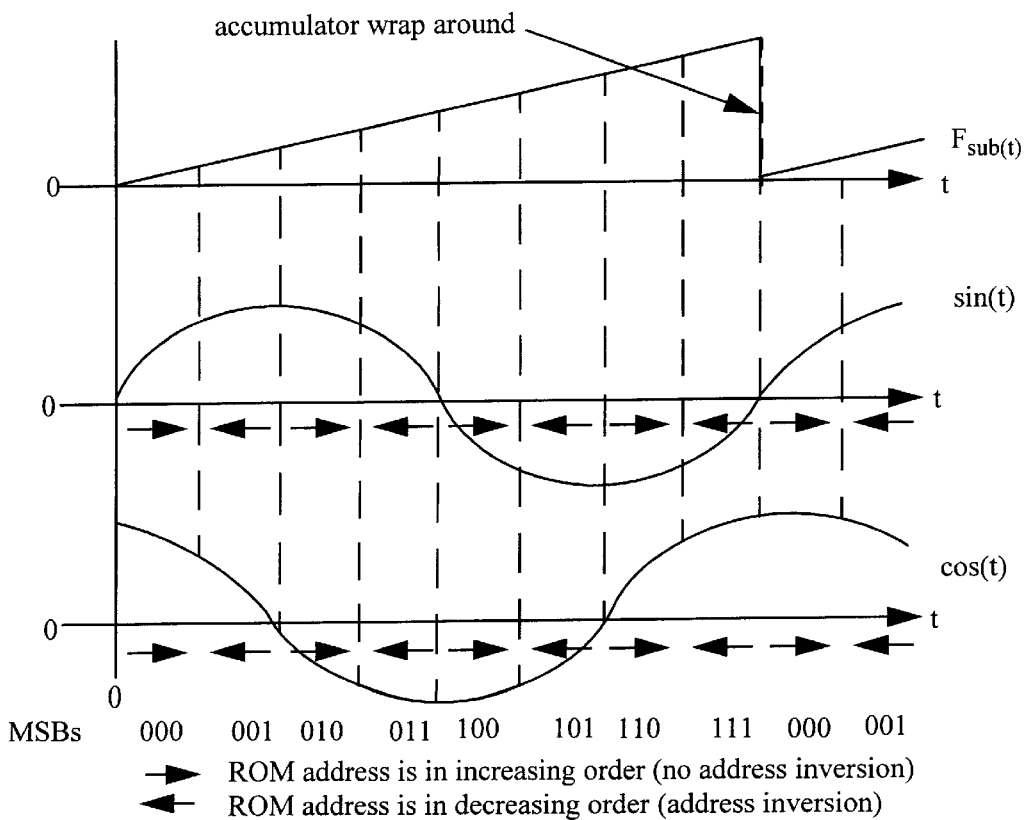
FIG. 13 is a graph illustrating a relationship between the output of the digital oscillator of FIG. 12 and digital sine and cosine values generated for the chroma modulator of FIG. 9.

Turning now to FIG. 13, there is shown a graph illustrating the relationship between the digital oscillator signal (Fsub) and the digital sine and cosine values provided by the sine/cosine generator (51 in FIG. 2) to the chroma modulator (49 in FIG. 2). The digital oscillator signal (Fsub) has the appearance of a serration pulse. The signals in FIG. 13 have been subdivided by dashed lines into sections including eight distinct 45° intervals of the sine and cosine signals. Each of the eight distinct 45° intervals is identified by a unique combination of the three most significant bits of the digital oscillator signal (Fsub). The value of the sine or cosine signal in each 45° interval can be found in response to the three most significant bits by selectively inverting the less significant bits of digital oscillator signal, accessing a respective table of sine or cosine values over the interval 0 to 45° with the selectively inverted less significant bits, and selectively complementing the value from the table.

Figure 14:
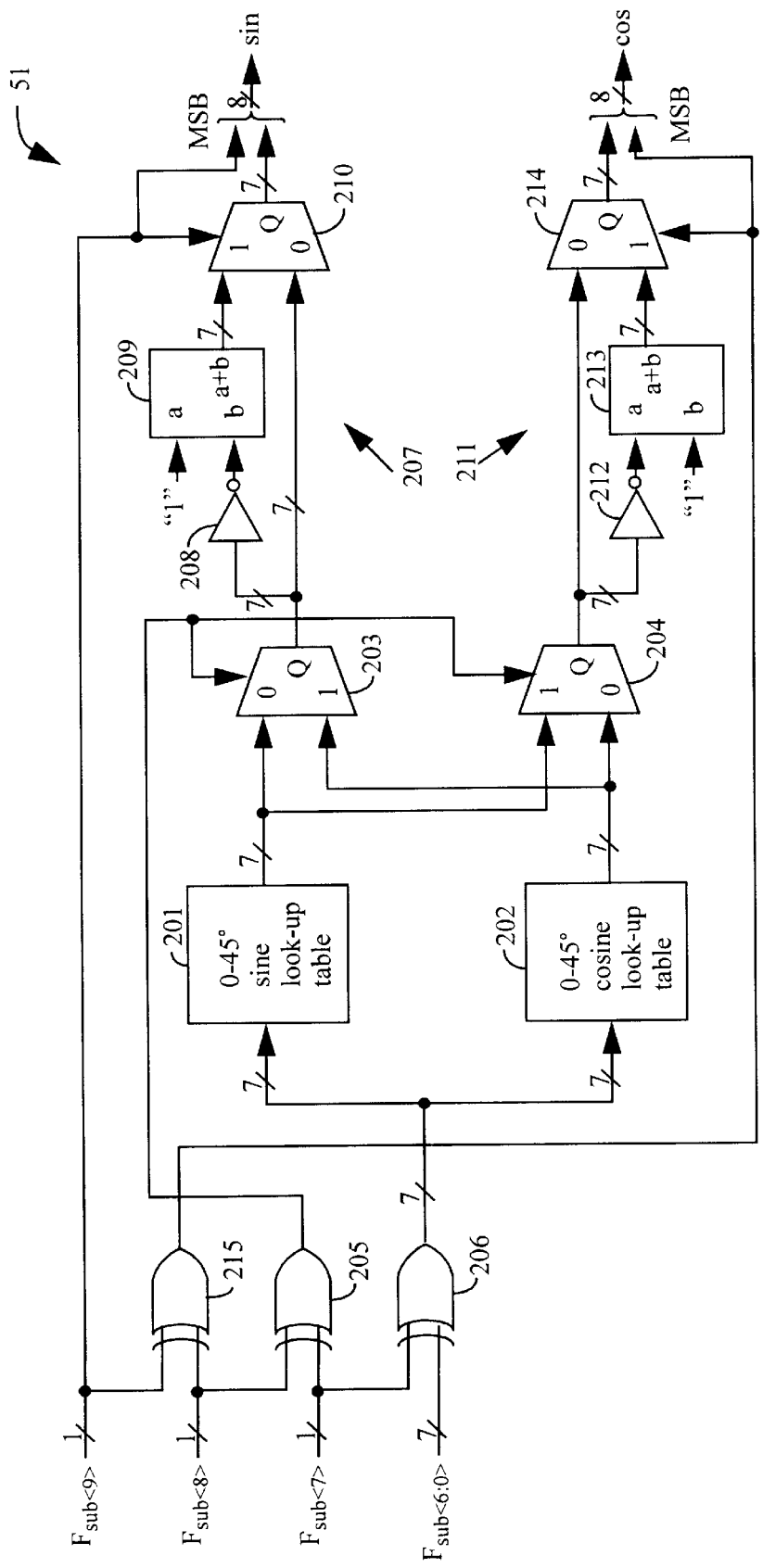
FIG. 14 is a schematic diagram of a sine/cosine generator that generates the digital sine and cosine values for the chroma modulator of FIG. 9 in response to the digital oscillator of FIG. 12.

Turning now to FIG. 14, there is shown a schematic diagram of the sine/cosine generator 51. The sine/cosine generator includes a first read-only memory (ROM) 201 programmed with a sine look-up table 201, and a second read-only memory (ROM) 202 programmed with a cosine look-up table 202. The values in the ROMs 201, 202 are given by the following equations:

$$\text{sine\_table}(i)=INT\ (127*\cos\ (2\pi(255.5-i)/1024))$$

$$\text{cosine\_table}(i)=INT\ (127*\cos\ (2\pi(i+0.5)/1024))$$

where i=0, 1, 2, . . . , 127.

At any given time, each ROM 201, 202 provides either the sine or the cosine signal, as selected by multiplexers 203, 204. Neither ROM provides both the sine or the cosine signal at any given time. The multiplexers 203, 204 are controlled by an exclusive-OR gate 205 generating the exclusive-OR of the Fsub<8> and Fsub<7> which are the two less significant of the three most significant bits of Fsub.

The less significant bits Fsub<6:0> which address the ROMs 201, 202 are selectively inverted by a set of exclusive OR gates 206 controlled by Fsub<7> which is the less significant of the three most significant bits of Fsub.

The value selected by the multiplexer 203 is selectively complemented by a two's-complement circuit generally designated 207 to provide the sine signal. The two's complement circuit is shown having an inverter 208 for computing a one's complement, and an adder 209 for adding a constant value of 1 to the one's complement to form the two's complement. A multiplexer 210 selects either the original value or the two's complement to provide the seven low-order bits of the sine signal. The multiplexer 210 is controlled by Fsub<9>, which is the most significant bit of Fsub. Fsub<9> also provides the sign bit of the sine signal.

The value selected by the multiplexer 204 is selectively complemented by a two's-complement circuit generally designated 211 to provide the cosine signal. The two's complement circuit is shown having an inverter 212 for computing a one's complement, and an adder 213 for adding a constant value of 1 to the one's complement to form the two's complement. A multiplexer 214 selects either the original value or the two's complement to provide the seven low-order bits of the sine signal. The multiplexer 214 is controlled by an exclusive-OR gate 215 generating the exclusive-OR of Fsub<9> and Fsub<8> which are the two most significant bits of Fsub. The exclusive-OR gate 215 also provides the sign bit of the cosine signal.

Figure 15:
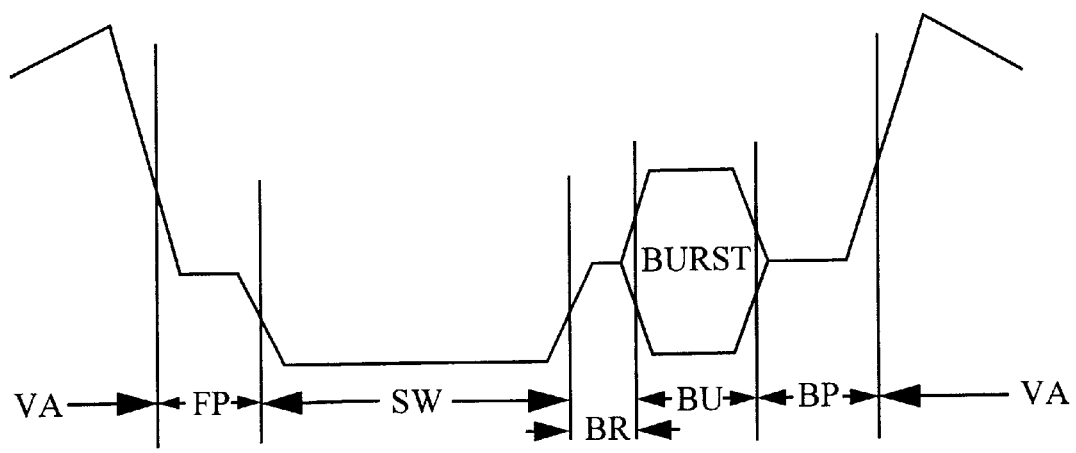
FIG. 15 is a timing diagram of the horizontal blanking interval of a video line in the NTSC/PAL format.

Turning now to FIG. 15, there is shown a timing diagram of the horizontal blanking interval of a video line including the horizontal sync and blanking inserted into the luma signal by the sync insertion circuits 56 of FIG. 2. The total duration of a video line is denoted by H. The various intervals labeled in FIG. 15 are defined in the table below.

| Parameter | Mnemonic | NTSC-M ($\mu$s) | PAL-B,G ($\mu$s) |
|---|---|---|---|
| Front porch | FP | 1.5 | 1.6 |
| Sync width | SW | 4.7 | 4.7 |
| Breezeway | BR | 0.6 | 0.9 |
| Burst length | BU | 2.5 | 2.25 |
| Back porch | BP | 1.6 | 2.55 |
| Active video | VA | 52.66 | 52.0 |
| Line time | H | 63.56 | 64.0 |

The line time H is related to the other parameters in the above table according to:

$$H=FP+SW+BR+BU+BP+VA.$$

Figure 16:
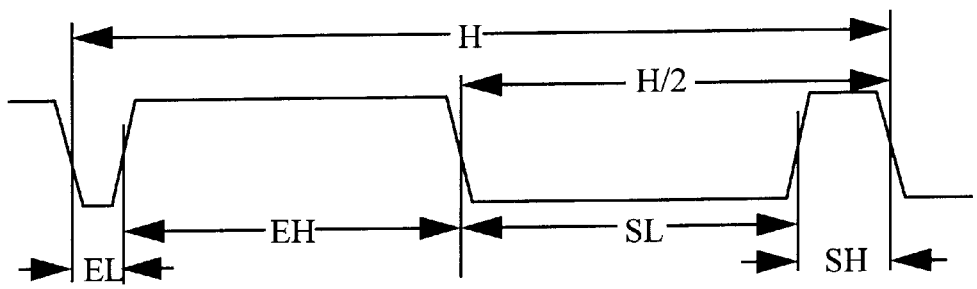
FIG. 16 is a timing diagram of a video line in the NTSC/PAL format during a vertical sync interval of a field.

During the vertical sync interval of a field, a video line has the appearance shown in FIG. 16. The various intervals labeled in FIG. 16 are defined in the table below:

| Parameter | Mnemonic | NTSC-M ($\mu$s) | PAL-B,G ($\mu$s) |
|---|---|---|---|
| Horizontal line | H | 63.56 | 64.0 |
| Sync low | SL | 27.1 | 27.3 |
| Sync high | SH | 4.7 | 4.7 |
| Equalization low | EL | 2.3 | 2.35 |
| Equalization high | EH | 29.48 | 29.65 |

The line time H is related to the other parameters in the above table according to:

$$H=((2\times SL)+(2\times SH))=((2\times EL)+(2\times EH))$$

The combinational logic (124 in FIG. 5) of the sync generation circuits (44 in FIG. 2) define the timing parameters in the above tables in terms of the pixel clock (fclk/2) cycle time (T) for a pixel clock frequency (fclk/2) of 13.5 MHz as shown in the table below:

| Parameter | NTSC 13.5 MHz | PAL 13.5 MHz |
|---|---|---|
| FP | 18T | 20T |
| SW | 60T | 60T |
| BR | 6T | 8T |
| BU | 34T | 31T |
| BP | 22T | 33T |
| EL | 30T | 30T |
| EH | 399T | 402T |
| SL | 369T | 372T |
| SH | 60T | 60T |
| H | 858T | 864T |
| nominal rise/fall times | 2T | 2T |

Blanking for NTSC occurs in scan lines 1–20 and 264–283, inclusive. Blanking also occurs in the last half of scan line 263 and in the first half of scan line 284.

Blanking for PAL occurs in scan lines 1–22, 311–335, and 624–625, inclusive. Blanking also occurs in the last half of scan line 623 and in the first half of scan line 23.

The sync insertion circuits (56 in FIG. 2) consist of a simple multiplexer that multiplexes the different sync and blanking DC values at the appropriate time into the luma signal (Y).

The output interpolation filters (53, 57 in FIG. 2) interpolate the chroma (U, V) and composite luma (Y) samples by a factor of 2. The chroma output interpolation filter (53 in FIG. 2) also reduces aliasing effects and is therefore a higher order filter. Because the interpolation filters upsample the luma and composite chroma signals by a factor of 2, the digital-to-analog converters (60–63 in FIG. 2) will run therefore at a higher sampling frequency of 27 MHz (fclk). This higher sampling frequency helps reduce the effect of the sin(x)/x roll-off inherent in the digital-to-analog conversion process upon the video signals, and reduces the complexity of the external analog low-pass filters.

Figure 17:
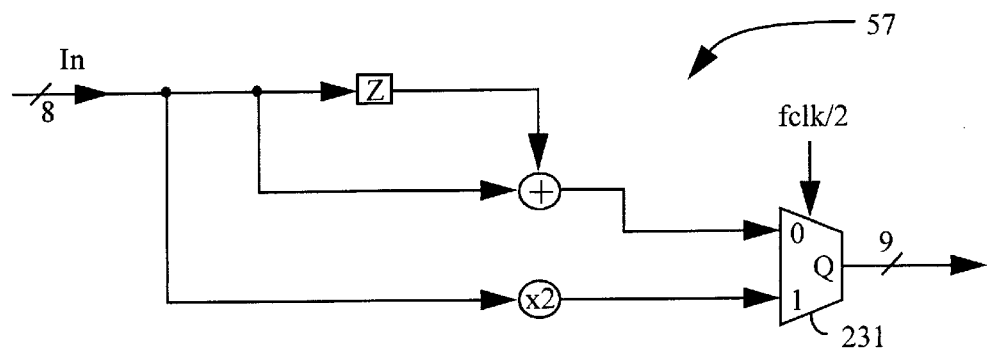
FIG. 17 is a block diagram of a luma output interpolation filter in the NTSC/PAL encoder of FIG. 2.

FIG. 17 shows a block diagram of the luma output interpolation filter 57. The original values pass through unchanged, and the interpolated pixels are averaged between the two nearest neighbors. The register (z) is clocked at the 27 MHz rate (fclk). The circle labeled "x2" represents an arithmetic left shift, which is performed merely by appending an additional least significant bit having a value of zero. A multiplexer 231 is operated at the 13.5 MHz rate (fclk/2) to alternately select the original values or the average values.

Figure 18:
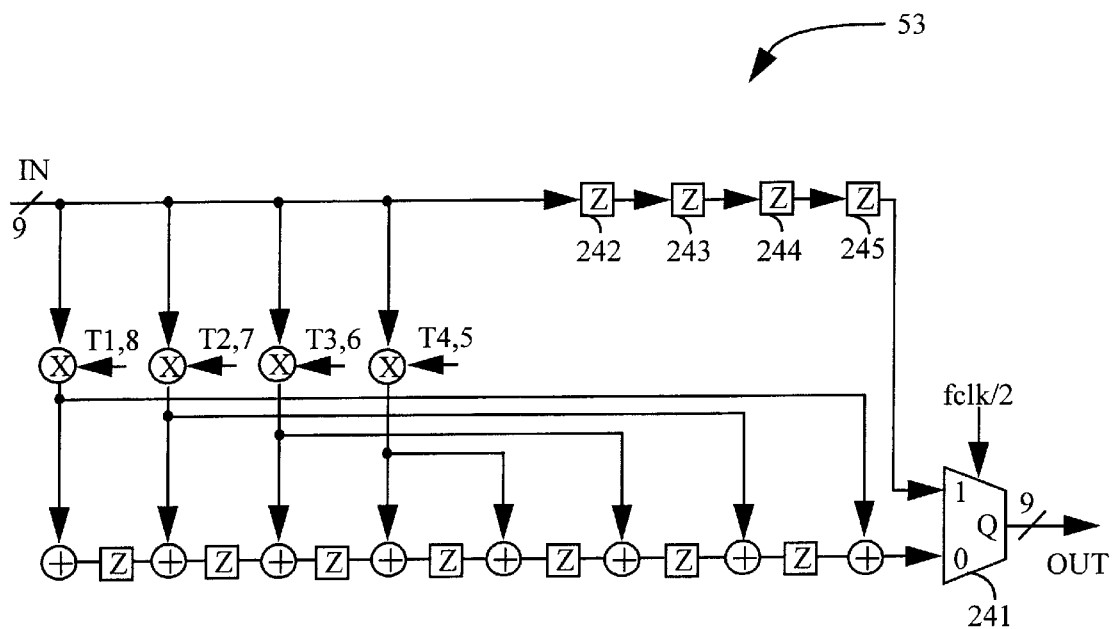
FIG. 18 is a block diagram of the chroma interpolation filter in the NTSC/PAL encoder of FIG. 2.

FIG. 18 shows a block diagram of the chroma output interpolation filter 53. The chroma output interpolation filter is a half-band filter and it also effectively reduces aliasing effects. The filter coefficients are shown in the following table.

| Filter Coefficients | Value   | Binary Value | Decimal Value |
|---------------------|---------|--------------|---------------|
| Tap 1, 8            | −2/128  | 1111 1110    | −0.015625     |
| Tap 2, 7            | +8/128  | 0000 1000    | +0.0625       |
| Tap 3, 6            | −21/128 | 1110 1011    | −0.1640625    |
| Tap 4, 5            | +79/128 | 0100 1111    | +0.6171875    |

The passband extends to about 5 MHz. and the 3 dB point is at about 6 MHz. The stopband begins at about 9 MHz with an attenuation of greater or equal to 40 dB. The filter 53 has a multiplexer 241 which is operated at the 13.5 MHz rate (fclk/2) to alternately select the original values or the filtered values. The filter 53 includes four delay registers 242, 243, 244, 245 providing the same signal delay when the original values are selected as when the filtered values are selected.

Figure 19:
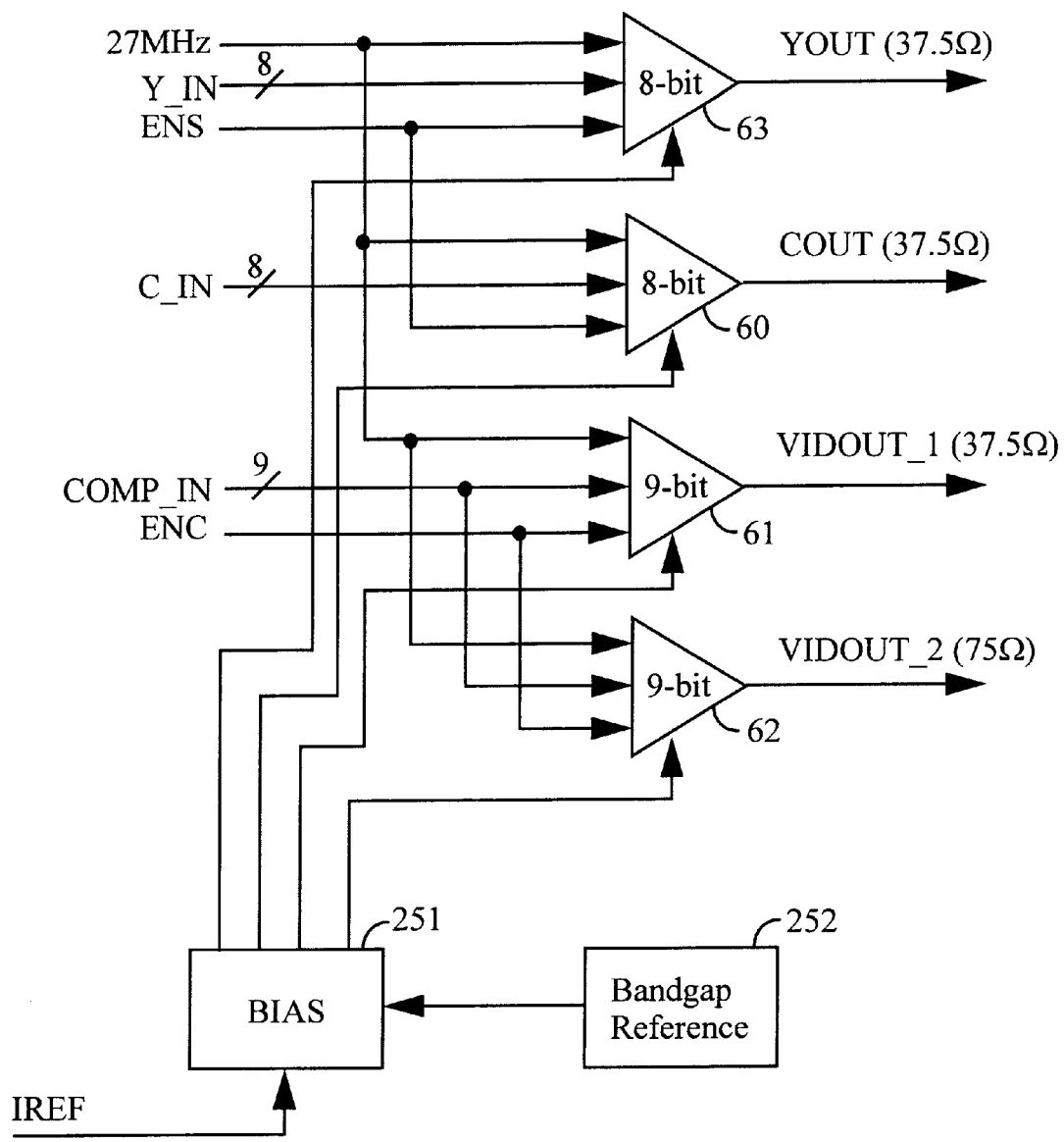
FIG. 19 is a block diagram of control circuits for digital-to-analog converters in the NTSC/PAL encoder of FIG. 2.

Turning now to FIG. 19, there is shown a block diagram of control circuits for the digital-to-analog converters 60, 61, 62, 63. If ENS is set to "0" (disable), the analog outputs of the 8-bit digital-to-analog converters 60 and 63 will tristate automatically (output current is zero), and the analog-to-digital converters will be turned off. If ENC is set to "0" (disable), the analog outputs of the 9-bit analog-to-digital converters 61 and 62 will tristate automatically (output current is zero) and the analog-to-digital converters will be turned off. ENC and ENS are bits of a control register in the register file (71 in FIG. 3), and these bits should be initially reset.

All of the digital-to-analog converters 60–63 run at the 27 MHz main clock frequency (fclk). The integral linearity error should not exceed 0.2% (0.2% is approximately equivalent to ½ LSB for an 8-bit DAC and about 1 LSB for a 9-bit DAC). The differential linearity error should not exceed 0.2%.

The 9-bit digital-to-analog converter 61 is designed to drive a 37.5Ω load such as an RCA jack with a 1.3 volt full-scale value, and the 9-bit digital-to-analog converter 62 is designed to drive a 75Ω load such as an RF modulator for channel 3 or 4 with a 1.3 volt full-scale value. The 8-bit digital-to-analog converters 60, 63 are designed to drive a 75Ω double terminated load (37.5Ω impedance) with a 1.0 volt full-scale value.

A bias circuit 251 generates all of the bias voltages for the digital-to-analog converters 60, 61, 62, 63 based on a reference created by a bandgap reference circuit 252. The bandgap reference circuit provides a reference voltage of about 1.235 volts that is substantially independent of the supply voltage over a supply voltage range of 4.75 volts to 5.25 volts. The bias circuit 251 generates from the reference voltage substantially independent bias voltages applied to the gates of P-channel transistors in the current cells of each of the digital-to-analog converters 60–63.

Figure 20:
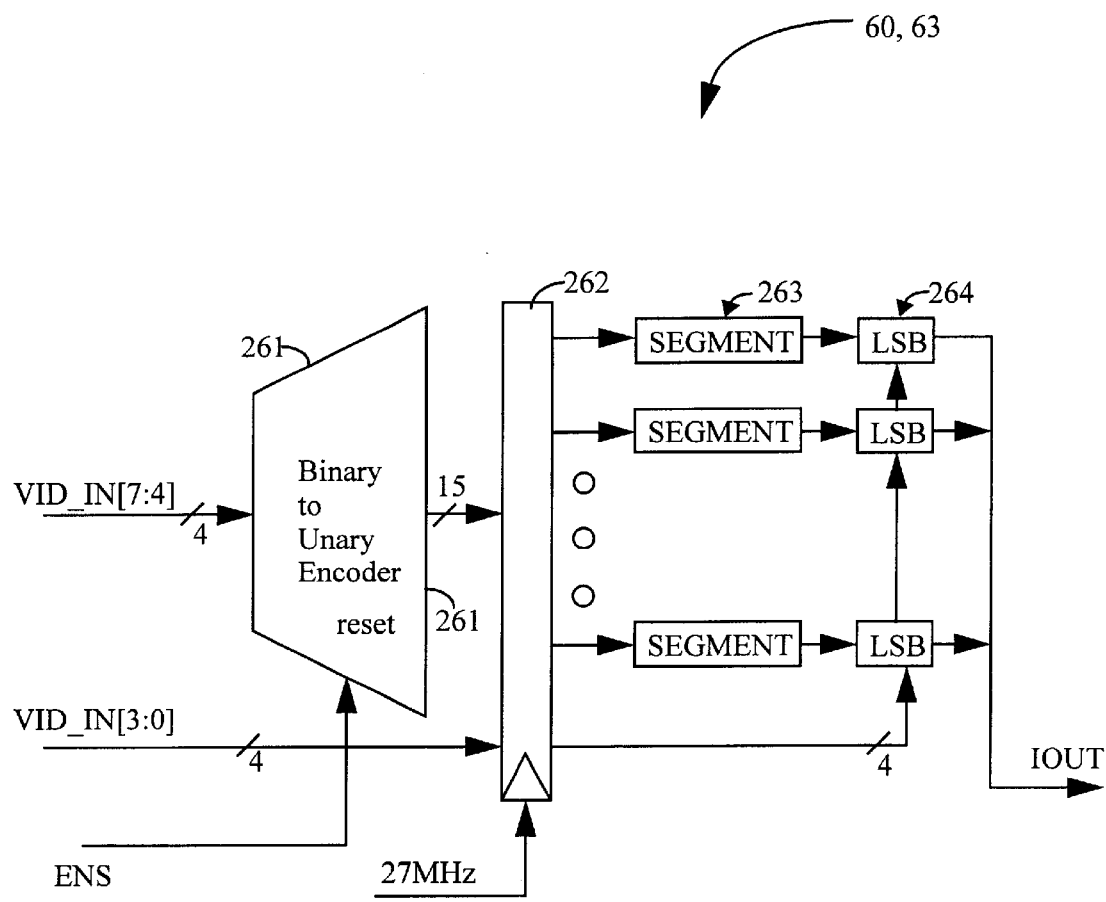
FIG. 20 is a block diagram of each of the eight-bit digital-to-analog converters in the NTSC/PAL encoder of FIG. 2.

FIG. 20 is a block diagram of each of the eight-bit digital-to-analog converters 60, 63. VID_IN[7,4] are the four most significant bits of the digital input, and VID_IN[3,0] are the four least significant bits of the digital input. The nine-bit digital-to-analog converters would have a similar structure, except that VID_IN[7,4] would be replaced by VID_IN[8,5], VID_IN[3,0] would be replaced by VID_IN[4,0], and ENS would be replaced by ENC.

As shown in FIG. 20, the four most significant input bits VID[7,4] are encoded by a binary-to-unary encoder (i.e., a thermometer encoder) which either resets all of its fifteen binary outputs to zero when all four most significant bits are zero, or sets only a respective one of its fifteen binary outputs to one when all four most significant input bits are not zero. A 19-bit pipeline register 262 receives the unary code and the four least significant input bits VID_IN[3:0]. The pipeline register applies the unary code bits to respective current source segments 263, and applies the four least significant input bits to the respective current cells 264 in each current source segment. Each segment 263 may be viewed as sixteen LSB current sources 264 enabled by a signal which originates from the binary-to-unary encoder. Thus each DAC consists of an array of 15*17 current sources. (The LSB of the 9-bit DACs would be connected to an additional LSB-current cell. The current output of that additional cell would then be added to the current output of the 8-bit MSB DAC array.) This design is a compromise between a fully thermometer decoded DAC and a fully binary DAC. It gives a good trade-off between layout size and minimization of differential nonlinearity errors.

Special care should be taken for the layout of the digital-to-analog converters. The layout of the binary-to-unary encoder and the current sources should be very closely coupled. In fact, the pitch of one current source should match the pitch for encoding one state. There is some IR drop on the VDD metal lines for each of the individual current cells. This IR drop should be matched between the cells.

As described above, a NTSC/PAL encoder has a color carrier synthesizer using digital circuitry operated by a 13.5 MHz system clock for synchronizing the digital color subcarrier to an analog reference signal from a local crystal oscillator. As described above with reference to FIG. 11, the frequency of the digital color subcarrier was compared to the frequency of the analog reference signal by an up/down counter 184 incrementing upon cycles of the reference signal and decrementing upon cycles of the digital color subcarrier. During a vertical blanking interval, the frequency of the digital color subcarrier was adjusted by the frequency comparison provided by the content of the up/down counter. In this fashion, the frequency of the digital subcarrier will substantially match the reference frequency despite variations in the frequency of the system clock.

Figure 21:
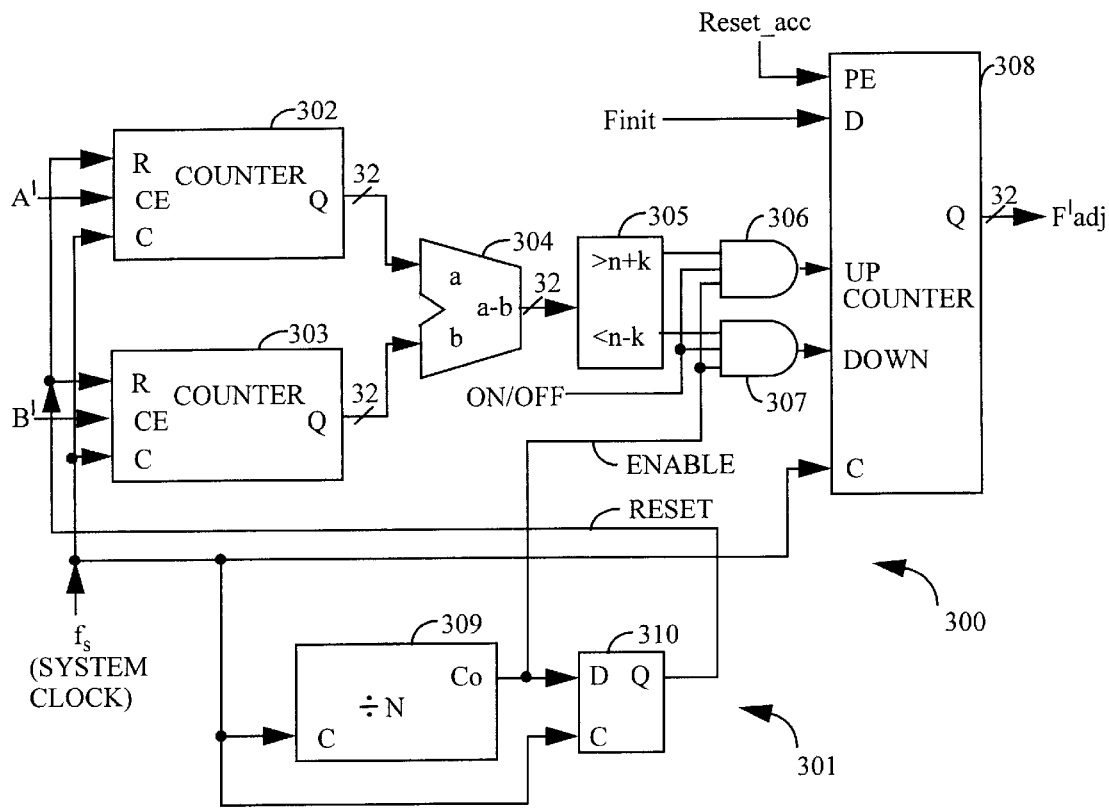
FIG. 21 is a schematic diagram of an alternative construction for a frequency comparator.

It should be apparent to persons of ordinary skill in the art that the frequency comparison and adjustment circuitry in FIG. 11 could be modified for other applications. For example, shown in FIG. 21 is an alternative embodiment of suitable frequency comparison and adjustment circuitry 30. This alternative embodiment could be substituted for the circuitry in FIG. 11. Also shown in FIG. 21 is sync generation circuitry that generates an enable signal (analogous to the color carrier reset signal in FIG. 11) and a reset signal (analogous to the Vsync signal in FIG. 11).

As shown in FIG. 21, digital pulses A' from a reference frequency source (such as the NOR gate 183 in FIG. 11) enable a first counter 302, and digital pulses B' from a digital oscillator (such as the digital oscillator 172 in FIG. 12) enable a second counter 303. A subtractor circuit 304 computes the difference between the count from the first counter 302 and the count from the second counter 303. A decoder 305 detects whether the difference from the subtractor circuit 304 is above or below a desired range of (n−k) to (n+k), where n is an integer and k is zero or a positive integer. The decoder 305 asserts a signal to an AND gate 306 when the difference from the subtractor circuit 304 is greater than (n+k), and the decoder asserts a signal to an AND gate 307 when the difference from the subtractor circuit is less than (n−k). The AND gates 306 and 307 are enabled by the ENABLE signal from the sync generation circuits 301. The AND gate 306 controls an UP input of an up/down counter 308, and the AND gate 307 controls the DOWN input of the up/down counter 309. The up/down counter 308 provides an adjustment value (F'adj) to the digital oscillator (such as the digital oscillator 172 in FIG. 12). The up/down counter 308 can be initially loaded with an initial value (Finit) when a master reset signal (Reset_acc) is asserted.

The sync generation circuits 301 include a counter 309 and a D-type flip-flop 310. The counter 309, for example, is a pixel counter (121 in FIG. 5) or line counter (122 in FIG. 5). In any case, the counter 309 counts an integer number (N) of system clock cycles over which the frequency comparison and adjustment circuitry 300 makes each frequency comparison and adjustment. The decoder 305, for example, functions as a kind of switch to enable an adjustment in frequency only when the difference in frequency between the frequencies of the A' and B' pulses falls outside the range of about $(f_s/N)(n-(k+\frac{1}{2}))$ to $(f_s/N)(n+k+\frac{1}{2})$. Therefore there are no adjustments in the case of a stable clock frequency after the adjustment circuits have made the desired frequency correction. The AND gates 306, 307 enable the counter only once every N cycles of the system clock (fs), and therefore the AND gates 306, 307 also function as a kind of switch to enable an adjustment in frequency only at the time of the ENABLE pulse every N cycles of the system clock (fs). The AND gates 306, 307 are also enabled or disabled by an ON/OFF signal, for example, permitting an external micro-controller to turn off the adjustment circuits in an application where the system clock would have a sufficiently stable frequency. The micro-controller could also turn off the adjustment circuits after a sufficient time for the adjustment circuits to correct for a frequency shift, in an application where the system clock would have an imprecise frequency but sufficiently low drift.

For the case of k=0, the frequency comparison and adjustment circuits 300 will adjust the frequency of the digital oscillator pulses (B') to be substantially equal to the frequency of the reference pulses (A') plus an offset of $(n/N)f_s$. For the case of n=0 and k=0, the frequency of the digital oscillator pulses (B') will become virtually equal to the frequency of the reference pulses (A'), giving substantially the same result as the frequency comparison and adjustment circuits 171 in FIG. 11. However, the circuits in FIG. 11 have the advantages that they require a reduced area of layout on a silicon chip, and they can track variations in frequency of the system clock more quickly. Moreover, depending on the initial frequency offset of the system clock from its expected initial value, it may take some time after the system is turned on for the adjustment circuitry to correct for the offset and generate a stable color subcarrier. The circuits in FIG. 21 can adjust the frequency (F'adj) by at most one least-significant bit during each adjustment cycle, or about 0.0112 Hertz per second for a system clock of 13.5 MHz and a maximum adjustment cycle rate at the vertical sync rate. In contrast, the circuits in FIG. 11 can adjust the frequency (F'adj) by multiple bits during each adjustment cycle. The circuits in FIG. 11, for example, are able to correct for a frequency offset at a rate of up to ±0.18 Hertz per second.

Figure 22:
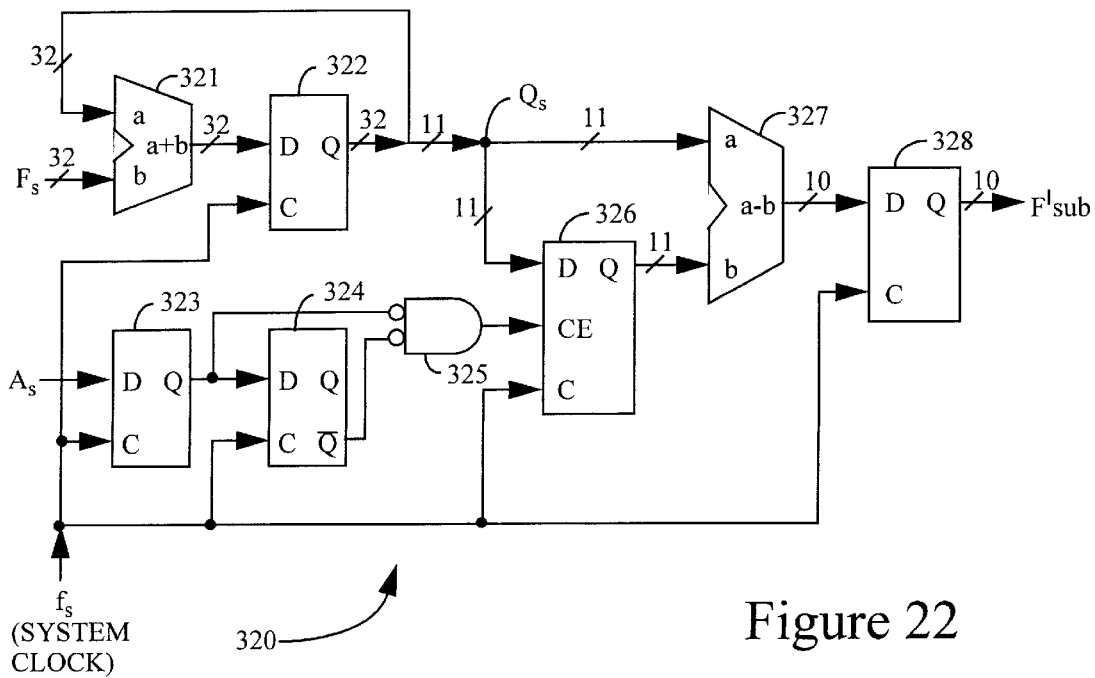
FIG. 22 shows an alternative embodiment of the invention in which a phase detector is used in a feed-forward loop for correcting the phase of a digital oscillator to produce a digital carrier signal having a frequency substantially matching the frequency of an analog reference signal.

Turning now to FIG. 22, there is shown an alternative embodiment of the present invention. The circuits generally designated 320 periodically generate a multi-bit number (F'sub) representing the phase of a sinusoidal signal in response to an analog reference signal (As). Moreover, the circuits 320 synchronize the frequency and phase of the time series of the multi-bit number (F'sub) to the frequency and phase of the analog signal (As). The values of the number (F'sub) are generated at the rate of the digital system clock (fs).

As shown in FIG. 22, a 32-bit adder 321 and an accumulator 322 comprise a digital oscillator adjusted by a value (Fs) to provide a periodic phase signal (Qs). The value (Fs) is preselected so that the periodic phase signal (Qs) has a nominal frequency close to the frequency of the analog reference signal (As). The analog reference signal, for example, is generated by a quartz crystal and a local oscillator. The analog reference signal (As) is converted to a series of pulses by D-type flip-flops 323 and 324 and a NOR gate 325. The pulses from the NOR gate 325 enable a multi-bit register 326 receiving the digital oscillator signal (Qs). The register 326 functions as a phase detector to register the phase of (Qs) coincident with each pulse from the NOR gate 325. A subtractor 327 subtracts the output of the register 326 from the digital oscillator signal (Qs), and the difference is received in an output register 328 to provide an adjusted digital oscillator signal (F'sub) synchronized to the analog reference signal (As). This adjusted digital oscillator signal (F'sub) could then be used to address a sine or cosine look-up table, such as the tables in FIG. 14, to generate digital sinusoidal carrier signals.

In contrast to the color carrier synthesis circuit 50 in FIG. 10 which has a feedback loop to adjust the frequency of the digital oscillator 50, the circuit 320 in FIG. 22 has a feed forward loop to adjust the phase of the digital oscillator signal (Qs). Although the circuit 320 of FIG. 22 is somewhat simpler than the color carrier synthesis circuit 50 of FIGS. 10, 11 and 12, it is more prone to noise in the analog reference signal (As). The circuit 320 of FIG. 22 also has the property that the instantaneous frequency of the adjusted digital oscillator signal (F'sub) is substantially constant except when the number in the register 326 changes. Therefore, in an application where the phase of the digital oscillator circuit is important, it is may be necessary to adjust more frequently the digital oscillator signal to avoid the build-up of excessive phase error.

In the circuit 320 of FIG. 22, the digital oscillator signal is adjusted at the frequency of the analog reference signal (As). In an application such as color subcarrier generation in a digital TV encoder, this adjustment could occur during the active portion of each video line, and could be noticeable unless the nominal frequency of the digital oscillator signal (Qs) is sufficiently close to the frequency of the analog reference signal (As) and the frequency of the system clock (fs) is sufficiently stable that the number in the register 326 changes by no more than one least-significant bit (for an 11-bit register) during each cycle of the analog reference signal (As). Although the phase change could be delayed until the end of a horizontal line or the end of the video field (for example by inserting an additional register between the register 326 and the subtractor 327 and enabling the clock of this additional register with Hsync or Vsync), the mismatch in instantaneous frequency along a line or over a video field may cause a non-uniform shift in hue along the line or over the video field.

While the invention has been described above with reference to specific embodiments, the description is not meant to be construed in a limiting sense. Various modifications of the disclosed embodiments, as well as other embodiments of this invention, will be apparent to persons skilled in the art upon reference to this description. It is therefore contemplated that these modifications and alternative embodiments will be covered by the appended claims. For example, it has been described that the frequency of the digital oscillator is adjusted by adjusting the amount by which the accumulator of the digital oscillator is incremented. For some applications, however, it might be possible to adjust the frequency of the digital oscillator in response to an adjustment value by adjusting the frequency of the system clock in response to the adjustment value.

The invention has been described in connection with a digital video system using MPEG2 video compression. The invention is also applicable to digital video systems employing other kinds of video compression or encoding. The invention could also be used in systems having nothing to do with digital video. For example, the invention could be useful in systems having multiple circuit boards, each of which has a respective digital sampling clock. In particular, when constructing personal computers, it is desirable to provide a number of sampling clock frequencies, and to accommodate various plug-in boards, each having a respective sampling clock. Similarly, the invention could be useful in systems having multiple integrated circuit chips, each of which has a respective digital sampling clock.

What is claimed is:

1. A method of synthesizing a periodic digital signal, said periodic digital signal having a series of multi-bit values at a periodic rate of a sampling clock, said method including the steps of:
   a) generating said periodic digital signal by clocking a digital oscillator with said sampling clock;
   b) comparing frequency or phase of said periodic digital signal to frequency or phase of a Periodic reference signal to produce an adjustment signal; and
   c) adjusting said periodic digital signal with said adjustment signal to synchronize said periodic digital signal to said periodic reference signal,
   wherein said step (b) of comparing includes counting cycles of said periodic digital signal during a time interval, counting cycles of said periodic reference signal during said time interval, and computing a difference between the counted cycles of the periodic reference signal and the counted cycles of the periodic digital signal.

2. The method as claimed in claim 1, wherein said digital oscillator is an adjustable frequency oscillator and said periodic digital signal is adjusted in said step (c) by adjusting said adjustable frequency oscillator with said adjustment signal.

3. The method as claimed in claim 2, wherein said step of generating said periodic digital signal includes incrementing an accumulator in said digital oscillator with said adjustment signal.

4. The method as claimed in claim 1, wherein said multi-bit values of said periodic digital signal represent phase of said periodic digital signal, and said periodic digital signal is adjusted in said step (c) by adding or subtracting said adjustment signal from said periodic digital signal.

5. The method as claimed in claim 1, which includes accumulating said adjustment signal over a time interval of multiple cycles of said sampling clock during which the frequency of the periodic digital signal is not adjusted, and adjusting said periodic digital signal in said step (c) after said time interval.

6. The method as claimed in claim 5, wherein said time interval is an interval including active video in a video signal, and said periodic digital signal is adjusted in said step (c) during a blanking interval of said video signal.

7. The method as claimed in claim 1, wherein said multi-bit value of said periodic digital signal represents phase of a sinusoidal signal, and said method includes producing said sinusoidal signal by addressing a table of sinusoidal values with said periodic digital signal.

8. A digital synthesizer for synthesizing a periodic digital signal, said periodic digital signal having a series of multi-bit values at a periodic rate of a sampling clock, said digital synthesizer comprising:
   a) a digital oscillator clocked by said sampling clock to generate said periodic digital signal, said digital oscillator also receiving an adjustment signal for adjustment of frequency or phase of said periodic digital signal; and
   b) a digital comparator clocked by said sampling clock and connected to said digital oscillator for comparing frequency or phase of said periodic digital signal to frequency or phase of a periodic reference signal to produce said adjustment signal,
   wherein said digital comparator includes a first counter for counting cycles of said periodic digital signal, a second counter for counting cycles of said periodic reference signal, and an arithmetic unit for computing a difference between the counted cycles of the periodic reference signal and the counted cycles of the periodic digital signal.

9. The digital synthesizer as claimed in claim 8, wherein said adjustment signal is a frequency setting value, and said digital oscillator includes an accumulator incremented or decremented by said frequency setting value during cycles of said sampling clock.

10. The digital synthesizer as claimed in claim 8, wherein said digital oscillator is an adjustable frequency oscillator and said adjustment signal is a frequency control signal.

11. The digital synthesizer as claimed in claim 8, wherein said multi-bit values of said periodic digital signal represent phase of said periodic digital signal, and said digital oscillator includes an arithmetic unit for adding or subtracting said adjustment signal from said periodic digital signal to synchronize said periodic digital signal to said periodic reference signal.

12. The digital synthesizer as claimed in claim 8, which further includes an accumulator connected to said digital comparator for accumulating said adjustment signal over intervals including multiple cycles of said sampling clock and connected to said digital oscillator for changing the frequency of said periodic digital signal only between the intervals.

13. The digital synthesizer as claimed in claim 8, wherein said multi-bit values of said periodic digital signal represents phase of a sinusoidal signal, and said digital synthesizer includes a memory holding a table of sinusoidal values and having an address input receiving said periodic digital signal for addressing said table with said periodic digital signal to produce said sinusoidal signal.

14. A digital synthesizer for synthesizing a periodic digital signal, said periodic digital signal having a series of multi-bit values at a periodic rate of a sampling clock, said digital synthesizer comprising:

a) an adjustable digital oscillator clocked by said sampling clock to generate said periodic digital signal, said adjustable digital oscillator having a frequency control input for receiving adjustment values for adjusting frequency of said periodic digital signal; and b) a frequency comparator connected to said adjustable digital oscillator for comparing the frequency of said periodic digital signal to a frequency of a periodic reference signal to produce said adjustment values;

wherein said digital oscillator includes an accumulator incremented or decremented by said adjustment values during cycles of said sampling clock to produce said periodic digital signal, and said frequency comparator includes a first counter responsive to said periodic reference signal for counting cycles of said periodic reference signal, a second counter connected to said digital oscillator for counting cycles of said periodic digital signal, and an arithmetic unit for computing a difference between counts of said first counter and counts of said second counter, said arithmetic unit having an output connected to said frequency control input of said digital oscillator for providing said adjustment values to said digital oscillator.

15. The digital synthesizer as claimed in claim 14, further including an adjustment accumulator for accumulating said adjustment values, said adjustment accumulator having an input connected to said output of said arithmetic unit for receiving adjustment values from said arithmetic unit, and said adjustment accumulator having an output connected to said frequency control input of said digital oscillator for providing accumulated adjustment values to said digital oscillator.

16. The digital synthesizer as claimed in claim 15, wherein said adjustment accumulator includes:

a decoder connected to said output of said arithmetic unit and having a first decoded output for indicating when said output of said arithmetic unit exceeds a first limit value, and having a second decoded output for indicating when said output of said arithmetic is below a second limit value; and a third counter connected to said first and second decoded output for being incremented or decremented after an accumulation interval when said output of said arithmetic unit exceeds said first limit value, and for being decremented or incremented after an accumulation interval when said output of said arithmetic unit is below said second limit value, said third counter having an output providing the output of said adjustment accumulator and being connected to said frequency control input of said digital oscillator for providing accumulated adjustment values to said digital oscillator.

17. A method of generating a digital color subcarrier in a digital video system, said digital video system having a system clock for clocking logic circuits for processing video samples, said method comprising the steps of:

(a) generating a periodic reference frequency signal asynchronous to said system clock, said periodic reference frequency signal having a certain reference frequency;

(b) generating a periodic digital signal by clocking a digital oscillator with said system clock, said periodic digital signal having a series of multi-bit values representing phase of said digital color subcarrier;

(c) comparing said periodic digital signal to said periodic reference frequency signal to produce adjustment values indicating degrees of synchronization of said periodic digital signal with said periodic reference frequency signal;

(d) adjusting said periodic digital signal with said adjustment signal to synchronize said periodic digital signal with said periodic reference frequency signal so that said periodic digital signal is adjusted to have a frequency substantially equal to said reference frequency; and (e) producing said digital color subcarrier from the adjusted periodic digital signal;

wherein said step (c) of comparing includes counting cycles of said periodic digital signal during a time interval, counting cycles of a periodic reference signal during said time interval, and computing a difference between the counted cycles of the periodic reference signal and the counted cycles of the periodic digital signal.

18. The method as claimed in claim 17, wherein said step (a) includes a local oscillator circuit exciting a quartz crystal to resonate at said reference frequency to generate said reference frequency signal.

19. The method as claimed in claim 17, wherein said digital oscillator is an adjustable frequency oscillator and said periodic digital signal is adjusted in said step (d) by adjusting said adjustable frequency oscillator with said adjustment signal.

20. The method as claimed in claim 19, wherein said step (a) of generating said periodic digital signal includes incrementing or decrementing an accumulator in said digital oscillator with said adjustment values.

* * * * *